United States Patent
Cern

(10) Patent No.: US 7,532,012 B2
(45) Date of Patent: May 12, 2009

(54) DETECTION AND MONITORING OF PARTIAL DISCHARGE OF A POWER LINE

(75) Inventor: Yehuda Cern, Efrat (IL)

(73) Assignee: Ambient Corporation, Newton, MA (US)

( * ) Notice: Subject to any disclaimer, the term of this patent is extended or adjusted under 35 U.S.C. 154(b) by 170 days.

(21) Appl. No.: 11/584,322

(22) Filed: Oct. 20, 2006

(65) Prior Publication Data

US 2008/0048710 A1   Feb. 28, 2008

Related U.S. Application Data

(60) Provisional application No. 60/819,072, filed on Jul. 7, 2006.

(51) Int. Cl.
  *G01R 31/12* (2006.01)
  *H01H 9/50* (2006.01)
(52) U.S. Cl. .................................... 324/536
(58) Field of Classification Search ............. 324/536
  See application file for complete search history.

(56) References Cited

U.S. PATENT DOCUMENTS

| | | | |
|---|---|---|---|
| 4,897,607 A * | 1/1990 | Grunewald et al. ......... 324/512 |
| 5,146,170 A | 9/1992 | Ishikawa et al. |
| 5,469,067 A | 11/1995 | Endoh et al. |
| 5,642,038 A | 6/1997 | Kim et al. |
| RE35,561 E | 7/1997 | Mashikian et al. |
| 5,828,227 A | 10/1998 | Shiota et al. |
| 6,064,172 A | 5/2000 | Kuznetsov |
| 6,192,317 B1 | 2/2001 | Yazici et al. |
| 6,297,642 B1 | 10/2001 | Shibahara et al. |
| 6,420,879 B2 | 7/2002 | Cooke |
| 6,445,189 B1 | 9/2002 | Pakonen |
| 6,507,181 B1 | 1/2003 | Pakonen et al. |
| 6,661,235 B2 | 12/2003 | Rokunohe et al. |
| 6,798,211 B1 | 9/2004 | Rockwell et al. |
| 6,809,523 B1 * | 10/2004 | Ahmed et al. ............... 324/520 |
| 6,822,457 B2 | 11/2004 | Borchert et al. |
| 6,876,203 B2 | 4/2005 | Blades |
| 6,937,027 B2 | 8/2005 | Koo et al. |
| 2005/0184737 A1 * | 8/2005 | Moriyama et al. .......... 324/536 |

* cited by examiner

*Primary Examiner*—Amy He
(74) *Attorney, Agent, or Firm*—Ohlandt, Greeley, Ruggiero & Perle, L.L.P.

(57) ABSTRACT

There is provided a method that includes (a) determining a characteristic of a fundamental spectral component of a spectrum of a power spectrum of noise on a power line, and (b) determining a condition of the power line based on the characteristic.

17 Claims, 17 Drawing Sheets

| Index k | Graph 220 | Graph 230 | Graph 240 | Graph 250 |
|---|---|---|---|---|
| 1 | -48.0 | 4.3 | 1 | 4.3 |
| 2 | -41.9 | 10.5 | 1 | 10.5 |
| 3 | -42.3 | 10.0 | 1 | 10.0 |
| 4 | -42.1 | 10.2 | 1 | 10.2 |
| 5 | -42.3 | 10.0 | 1 | 10.0 |
| 6 | -43.2 | 9.1 | 1 | 9.1 |
| 7 | -43.8 | 8.5 | 1 | 8.5 |
| 8 | -43.3 | 9.0 | 1 | 9.0 |
| 9 | -45.8 | 6.5 | 1 | 6.5 |
| 10 | -59.6 | -7.3 | 1 | -7.3 |
| 11 | -44.2 | 8.1 | 1 | 8.1 |
| 12 | -60.3 | -8.0 | 1 | -8.0 |
| 13 | -38.6 | 13.8 | 1 | 13.8 |
| 14 | -54.2 | -1.9 | -1 | 1.9 |
| 15 | -60.2 | -7.9 | -1 | 7.9 |
| 16 | -60.3 | -8.0 | -1 | 8.0 |
| 17 | -60.0 | -7.7 | -1 | 7.7 |
| 18 | -60.3 | -8.0 | -1 | 8.0 |
| 19 | -60.4 | -8.1 | -1 | 8.1 |
| 20 | -60.6 | -8.3 | -1 | 8.3 |
| 21 | -60.7 | -8.4 | -1 | 8.4 |
| 22 | -61.0 | -8.7 | -1 | 8.7 |
| 23 | -60.9 | -8.6 | -1 | 8.6 |
| 24 | -61.2 | -8.9 | -1 | 8.9 |
| 25 | -61.0 | -8.7 | -1 | 8.7 |
| 26 | -61.2 | -8.9 | -1 | 8.9 |
| 27 | -61.1 | -8.8 | -1 | 8.8 |
| 28 | -61.1 | -8.8 | -1 | 8.8 |
| . | . | . | . | . |
| . | . | . | . | . |
| 386 | -56.1 | -3.8 | -1 | 3.8 |
| 387 | -55.9 | -3.6 | -1 | 3.6 |
| 388 | -56.4 | -4.1 | -1 | 4.1 |
| 389 | -55.7 | -3.4 | -1 | 3.4 |
| 390 | -55.7 | -3.4 | -1 | 3.4 |
| 391 | -56.6 | -4.3 | -1 | 4.3 |
| 392 | -56.3 | -4.0 | -1 | 4.0 |
| 393 | -56.8 | -4.5 | -1 | 4.5 |
| 394 | -56.4 | -4.1 | 1 | -4.1 |
| 395 | -57.0 | -4.7 | 1 | -4.7 |
| 396 | -56.5 | -4.2 | 1 | -4.2 |
| 397 | -47.9 | 4.4 | 1 | 4.4 |
| 398 | -40.5 | 11.8 | 1 | 11.8 |
| 399 | -35.5 | 16.8 | 1 | 16.8 |
| 400 | -37.7 | 14.6 | 1 | 14.6 |
| 401 | -38.9 | 13.4 | 1 | 13.4 |

*Fig. 2C*

DETECTION AND MONITORING OF PARTIAL DISCHARGE OF A POWER LINE

CROSS-REFERENCE TO RELATED APPLICATIONS

The present application is claiming priority of U.S. Provisional Patent Application No. 60/819,072, filed Jul. 7, 2006, the content of which is herein incorporated by reference.

BACKGROUND OF THE INVENTION

1. Field of the Invention

The present invention relates to automated monitoring of the condition of medium and high voltage cables and insulators in an electrically noisy environment, and more particularly, to alternating current (AC) power line discharge. The present invention is particularly advantageous in a case where a power line communications infrastructure is available to carry monitoring data to a central location.

2. Description of the Related Art

Partial discharge (PD) is a phenomenon that occurs in insulation that has sustained damage, such as through aging, physical damage, or exposure to excessively high electric fields. PD may afflict cables, connectors, surge arrestors, and other high voltage devices. Faulty overhead insulators may also generate noise with frequency and phase characteristics similar to PD. PD generates short pulses, whose duration is in the nano-second range or shorter. PD pulses tend to occur at certain phases of an AC power voltage, and tend to be roughly synchronized with the power frequency or twice the power frequency. PD is a member of a class of noise known as line-synchronized noise or line-triggered noise. PD pulses have a continuous broadband spectrum spanning at least a range between kilohertz and hundreds of megahertz.

Many techniques exist for sensing and identifying signals generated by PD on a power line, and for providing an indication of the location of the PD source. For example, Boggs, S. A., The Case for Frequency Domain PD Testing in the Context of Distribution Cable, IEEE Electrical Insulation Magazine, Vol. 19, No. 4, July-August 2003, describes a method for PD detection in the frequency domain, in which the frequency axis is synchronized to a phase of a power voltage on the power line.

These techniques are generally employed after a cable is suspected of PD, and may not be practical for permanent deployment, due to lack of an ability to readily communicating the information to some central location or due to excessive cost. A disadvantage of some of these techniques is their requirement that PD signals be the strongest signals present, and so, such techniques may not function well in a field environment that includes strong radio signals that are picked up by the cable. The radio signals and other forms of external interference are termed "ingress."

SUMMARY OF THE INVENTION

There is provided a method that includes (a) determining a characteristic of a fundamental spectral component of a spectrum of a power spectrum of noise on a power line, and (b) determining a condition of the power line based on the characteristic.

BRIEF DESCRIPTION OF THE DRAWINGS

FIG. 2C is a table of values for a portion of the graphs of FIGS. 2A and 2B.

DESCRIPTION OF THE INVENTION

In a power line communication system, power frequency is typically in a range of 50-60 Hertz (Hz) and a data communications signal frequency is greater than about 1 MHz, and typically in a range of 1 MHz-50 MHz. A data coupler for power line communications couples the data communications signal between a power line and a communication device such as a modem.

An example of such a data coupler is an inductive coupler that includes a core, and a winding wound around a portion of the core. The core is fabricated of a magnetic material and includes an aperture. The inductive coupler operates as a transformer, and is situated on a power line such that the power line is routed through the aperture and serves as a primary winding of the transformer, and the winding of the inductive coupler serves as a secondary winding of the transformer. The data communications signal is coupled between the power line and the secondary winding via the core. The secondary winding is coupled, in turn, to the communication device.

A further use for an inductive coupler is to place the inductive coupler around a phase conductor, and sense high frequency energy generated by PD. The synergy achieved by a combination of functions, including a continuous sensing of the cable and insulator condition, and data communications, is particularly advantageous.

Capacitive couplers may also be used for PD sensing and for communications. However, high voltage capacitors are themselves vulnerable to the development of internal PD that may be difficult to distinguish from cable or insulation PD. Therefore, although capacitive couplers may be used for sensing PD, inductive couplers are better suited for this task.

Figure 1A:
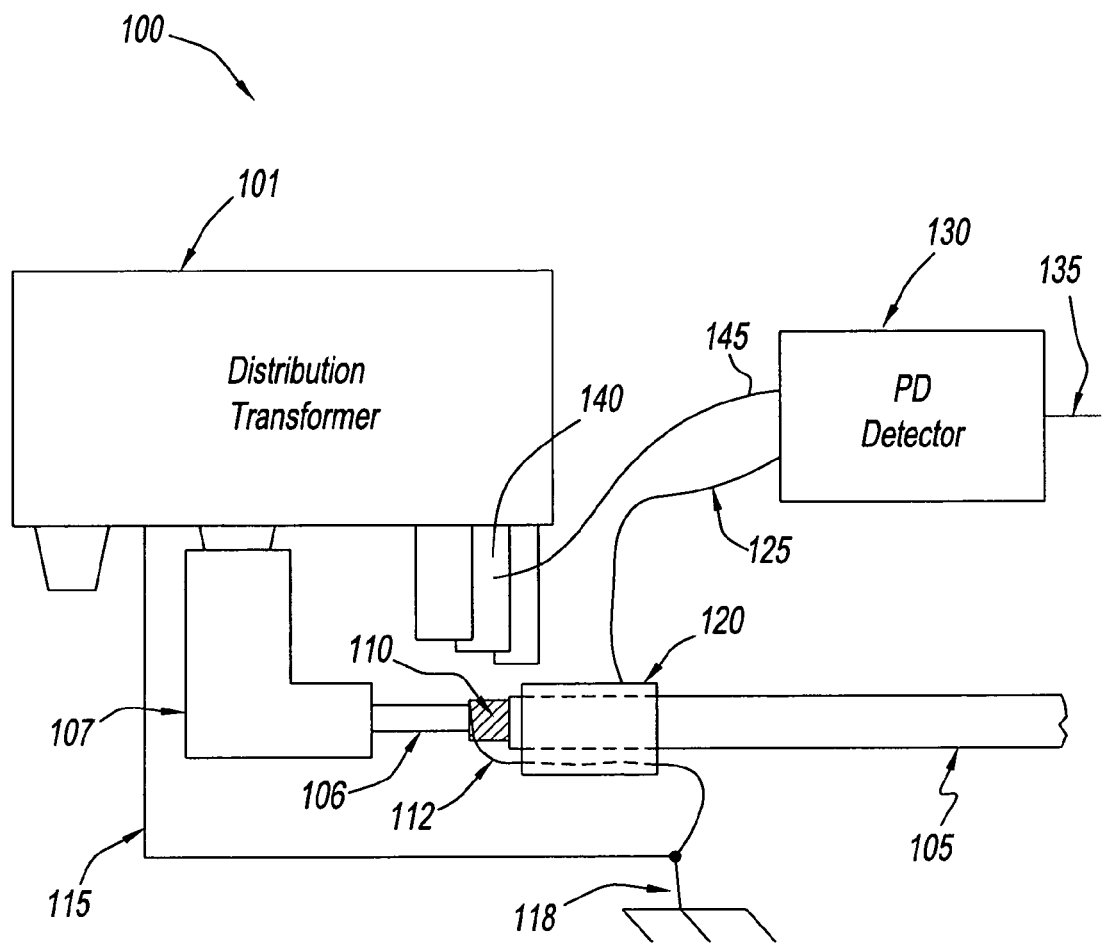
FIG. 1A is an illustration of a portion of a power distribution system configured with an arrangement of components to detect PD on a cable in the power distribution system.

FIG. 1A is an illustration of a portion of a power distribution system 100 configured with an arrangement of components to detect PD on a cable in system 100. System 100 includes a medium voltage underground cable, i.e., a cable 105, a distribution transformer 101, a ground rod 118, an inductive coupler, i.e., a coupler 120, and a PD detector 130.

Distribution transformer 101 is fed by cable 105, via an elbow connector 107. Distribution transformer 101 has a neutral conductor 115 connected to ground rod 118, and a secondary terminal 140. From secondary terminal 140, distribution transformer 101 provides a low voltage at power frequency.

Figure 1B:
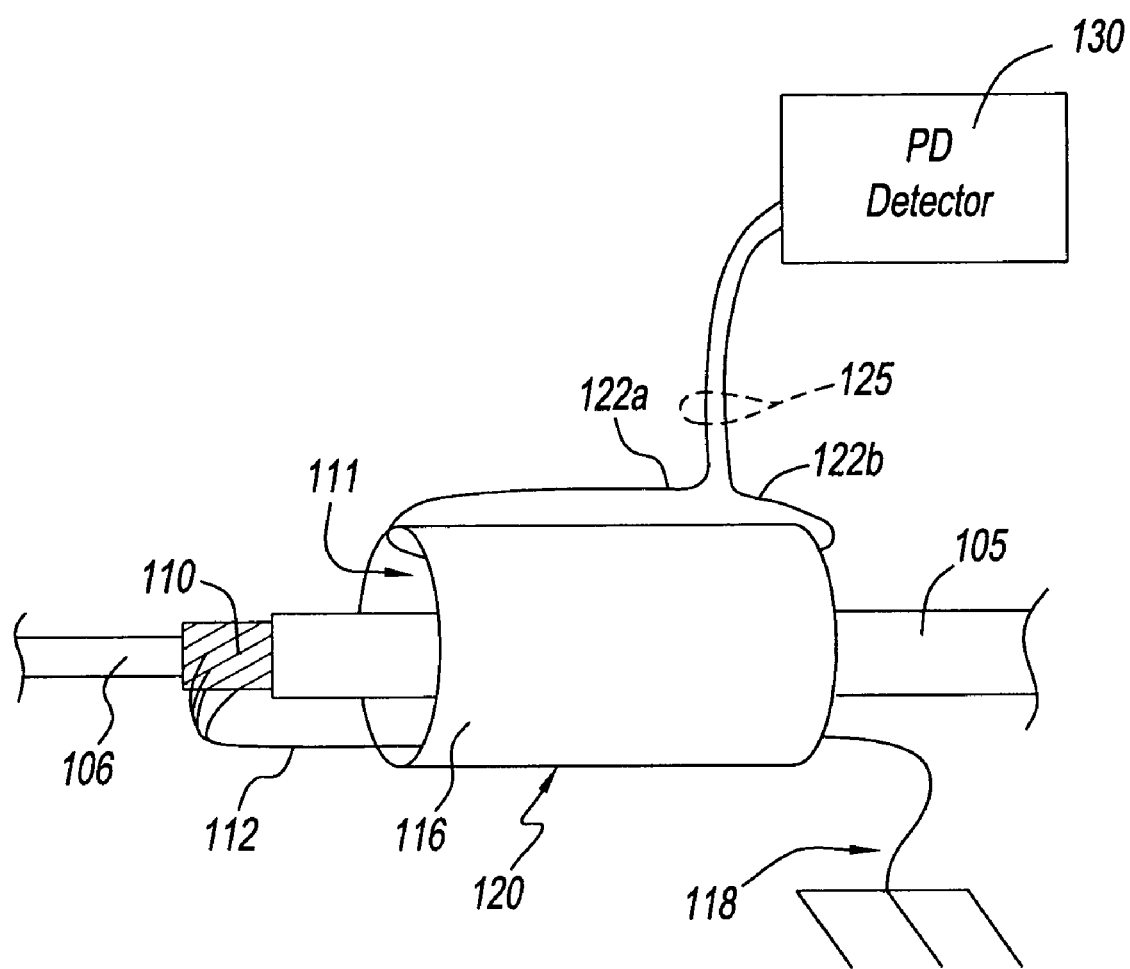
FIG. 1B is another view of a portion of the system of FIG. 1A, showing an arrangement of a coupler on a cable.

FIG. 1B is another view of a portion of system 100, showing an arrangement of coupler 120 on cable 105. Coupler 120 includes a magnetic core, i.e., a core 116, having an aperture 111 therethrough. Coupler 120 operates as a current transformer, and is situated on cable 105 such that cable 105 is routed through aperture 111 and serves as a primary winding of coupler 120. Coupler 120 also includes a secondary winding having leads 122a and 122b that run to PD detector 130 via a cable 125. Cable 105 has concentric neutral conductors 110 that are gathered together as a braid 112 and routed through aperture 111 to ground rod 118.

The routing of braid 112 through aperture 111 results in cancellation of neutral current induction into the coupler secondary, as described in U.S. Pat. No. 6,975,210. The net result is that coupler 120 senses current in a phase conductor of cable 105, including power frequency current and currents due to PD and ingress. The sensed current is available at the secondary winding, i.e., leads 122a and 122b, of coupler 120.

As an alternative arrangement of coupler 120 on cable 105, or in a case where cable 105 does not include concentric neutral conductors 110, such as in a multi-phase power cable, coupler 120 may be placed directly on insulation 106 of the phase wire. In such a case, coupler 120 would preferably be packaged within a robust grounded conductive shield capable of routing fault current to ground, should the phase conductor's insulation fail.

Referring again to FIG. 1A, there is a fixed phase relationship between the phase of a voltage (and current) on cable 105, and the phase of the low voltage on secondary terminal 140.

PD detector 130 receives the sensed current from coupler 120 via cable 125, and receives the low voltage at power frequency from secondary terminal 140 via a cable 145. The low voltage at power frequency provides a phase reference for detector 130. PD detector 130 processes the sensed current from coupler 120 to detect PD in cable 105, and provides an output 135 that is connected to a communications link (not shown in FIG. 1A), allowing an ongoing stream of PD monitoring data to reach a remote monitoring station (not shown in FIG. 1A).

Coupler 120 also serves as a power line communications data coupler. That is, cable 125 is also routed to a communication device (not shown in FIG. 1A), and coupler 120 is employed to couple a data communication signal between cable 105 and the communication device.

A partial discharge generates a broad band of noise, and therefore, an individual partial discharge includes spectral components throughout a wide range of frequencies. Also, the duration of an individual partial discharge is very brief, typically on the order of a few nanoseconds. As a spectrum analyzer sweeps through a range of frequencies, the spectrum analyzer acquires spectral activity that occurs at the point in time along the horizontal scale to which the sweep has progressed. Thus, although the spectrum analyzer's horizontal scale is normally considered as a frequency scale, it may also be interpreted as a phase scale and as a time scale.

Figure 2A:
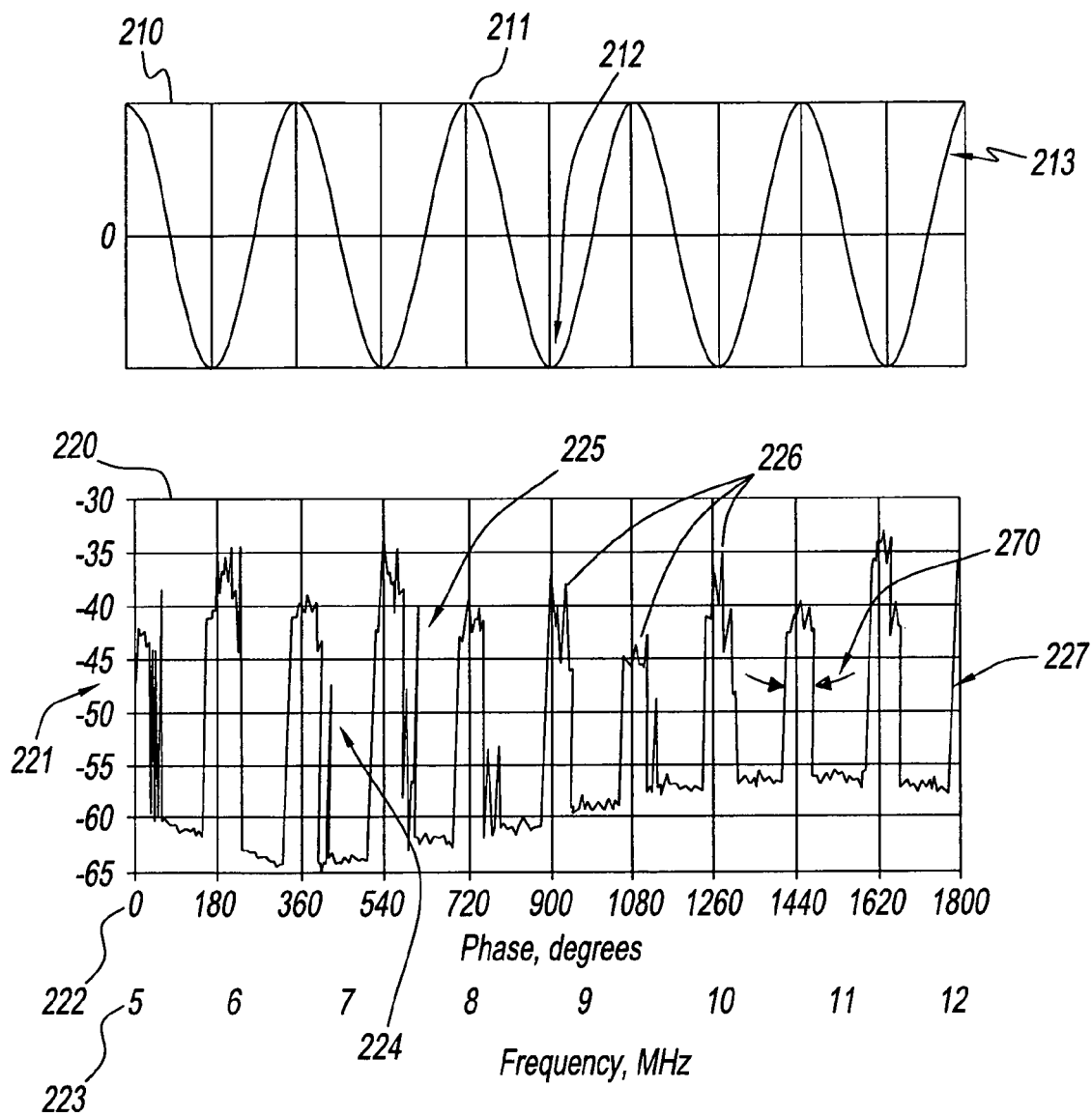
FIGS. 2A and 2B are graphs that illustrate various waveforms in a process for detecting PD on a cable.
Figure 2B:
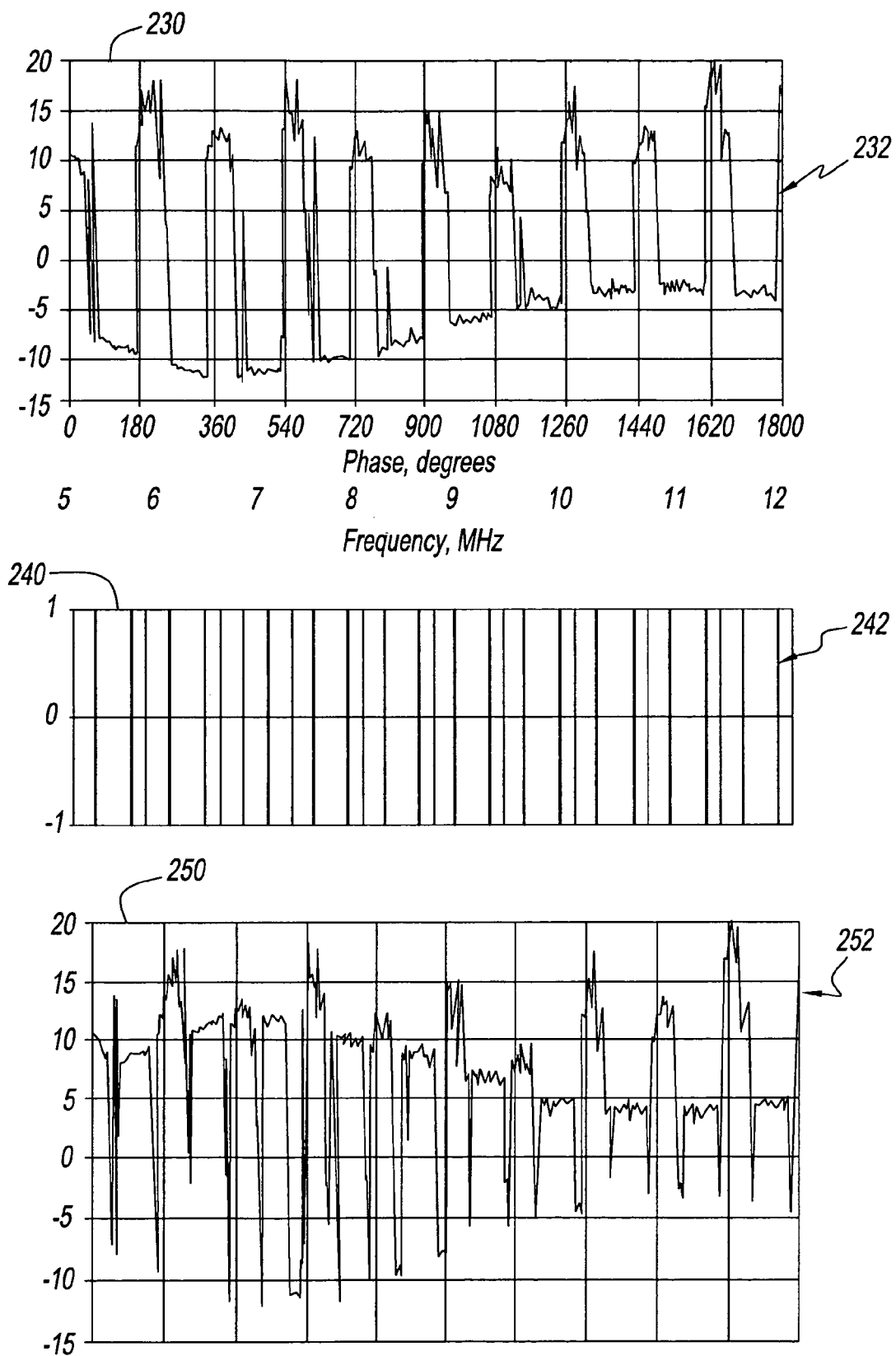

FIGS. 2A and 2B are a set of graphs, namely graphs 210, 220, 230, 240 and 250, that illustrate various waveforms in a process for detecting PD on cable 105. FIG. 2C is a table of values for a portion of graphs 220, 230, 240 and 250.

Graph 210 is a normalized power line voltage wave, i.e., a cosine voltage wave 213, of the voltage on cable 105. The horizontal scale of graph 210 is in units of phase. Positive peaks 211 and negative peaks 212 alternate every 180 degrees.

Depending on the nature of the insulation damage of cable 105, PD pulses will occur near positive peaks 211, near negative peaks 212, or near both of positive peaks 211 and negative peaks 212. Should PD occur mainly on one polarity only (i.e., only on positive peaks 211 or only on negative peaks 212) the discharge will feature a periodicity of once per cycle, or 360 degrees. Should substantial discharge occur on both positive peaks 211 and negative peaks 212, the discharge will feature a periodicity of twice per cycle, or 180 degrees.

In cases where PD occurs on most power voltage cycles, and over a wide range of phase angles, it is advantageous to process the spectral data acquired from single sweeps of a spectrum analyzer.

In other cases, PD spectral lines may appear sporadically, and be barely present or completely absent on some sweeps of the spectrum analyzer. In these cases it is advantageous to accumulate a set of the highest values of spectrum measured over a number N of frequency sweeps, and this is performed by calculating a "max hold" value for each of the spectral lines.

A "max hold" of a spectrum is a plot of maximum magnitude values for frequency components of the spectrum. That is, the max hold spectrum is a composite of a plurality of spectra, where the composite is configured of a greatest magnitude detected for each of the plurality of spectra. For example, assume that a spectrum analyzer is evaluating a signal that includes a frequency component at 7.4 MHz. Further assume that the spectrum analyzer makes several sweeps, and that during the several sweeps, the spectrum analyzer senses the 7.4 MHz component spanning a range of magnitudes from −45 dBm to −38 dBm. For the 7.4 MHz component, the spectrum analyzer would present a "max hold" value of −38 dBm.

Graph 220 is a synchronized "max hold" spectrum, i.e., a spectrum 227, of signals on cable 105, as indicated by a spectrum analyzer having its sweep triggered by a signal having a specific phase relationship with cosine voltage wave 213. More specifically, in graph 220, the spectrum analyzer has its sweep triggered at a 0 degree phase angle of cosine voltage wave 213, has a sweep duration of 1800 degrees, or 5 complete cycles of cosine voltage wave 213, and has a start frequency of 5 MHz and a stop frequency of 12 MHz. Graph 220 has a logarithmic vertical scale 221, in dBm, and two horizontal axes, namely an axis that designates a power line phase 222, and an axis that designates a noise frequency 223.

In graph 220, since the spectrum analyzer is triggered at a 0 degree phase angle of cosine voltage wave 213, there is a fixed relationship between the sweep of the spectrum analyzer and the phase of cosine voltage wave 213. For example, when cosine voltage wave 213 is at phases of 180 degrees and 360 degrees, the sweep of spectrum analyzer is evaluating frequencies of about 5.8 MHz and 6.5 MHz respectively. Note that a constant phase triggering of the spectrum analyzer sweep produces a fixed relationship between the power line phase 222 and noise frequency 223. Thus, spectrum 227 is a line-triggered noise power spectrum of signals on cable 105.

Spectrum 227 was experimentally measured at a PD magnitude of 25 picocoulombs. When PD or other line-synchronized megahertz noise is present, a line-triggered noise power spectrum such as spectrum 227 will have considerable periodicity, corresponding to the line frequency (360 degrees), or twice the line frequency (180 degrees). Spectrum 227 displays spectral components 226 peaking around each integer multiple of 180 degrees of phase. Spectrum 227 also includes spectral peaks 224 and 225 at approximately 6.9 MHz and 7.5 MHz, respectively, that do not fall within the spectrum at integer multiples of 180 degrees of phase. Spectral components 226 are indicative of PD. Spectral peaks 224 and 225 are spectral contributions from a source other than PD, such as ingress from radio broadcasts or transient noise from switching loads on or off in a vicinity of cable 105.

An objective of the method being described herein is to recognize that spectral components 226 are indicative of PD, and that spectral peaks 224 and 225 are spectral contributions from a source other than PD. Accordingly, the method proceeds, as described below, to perform a spectral analysis of spectrum 227.

One possible technique for performing a spectral analysis of spectrum 227 is to calculate a cepstrum of the signals on cable 105. A cepstrum is a Fourier transform of the logarithm of a spectrum. That is, it is the result of taking the Fourier transform of the log-magnitude of the spectrum, as if the log-magnitude of the spectrum were a signal. Thus, a cepstrum is a spectrum of a spectrum. In the context of the present example, the cepstrum of the signals on cable 105 would be found by calculating a Fourier transform of spectrum 227. The cepstrum would reveal the intensified spectral activity, e.g., spectral components 226, at the frequencies that correspond to integer multiples of 180 degrees of phase of cosine voltage wave 213, thus revealing the existence of PD.

However, as mentioned above, for the detection of PD, the spectral regions of interest occur at integer multiples of 180 degrees of phase. Therefore, an alternative to calculating the cepstrum is to determine a fundamental component of the cepstrum by correlating spectrum 227 with a template that screens the spectral regions of spectrum 227 at integer multiples of 180 degrees of phase. Graphs 230, 240 and 250 illustrate this technique.

For purposes of visualizing the correlation, zero-frequency components in spectrum 227 are eliminated, as explained below, by centering spectrum 227 around an average value.

Graph 230 is a zero-centered version of graph 220, and thus shows a zero-centered spectrum, i.e., a spectrum 232. Graph 230 effectively eliminates any zero-frequency components that may exist in spectrum 227, wherein spectrum 227 is viewed as a wave subject to a second process of spectrum analysis. Spectrum 232 is obtained by computing an average value of spectrum 227, and subtracting that average from every one of its points, thus yielding spectrum 232. More specifically, for graph 220 (and for convenience see FIG. 2C):

Average=((−48.0)+(−41.9)+. . . +(−37.7)+(−38.9))/ 401=−52.3.

Points for graph 230 are obtained by adding 52.3 to the value for each point of graph 220. For example, the first point of graph 220 has a value of −48.0. Accordingly, the first point of graph 230 has a value of 4.3, where:

4.3=(−48.0)+52.3.

Graph 240 is a template 242 for converting points of spectrum 232 (i.e., graph 230) into another set of points (discussed below in the context of graph 250). Template 242 has values of either +1 or −1, and is constructed symmetrical around zero. In template 242, the area above zero is equal to the area below zero. Thus, template 242 has a net area of zero.

The values of +1 occur in vicinities corresponding to phase being an integer multiple of 180 degrees. The values of −1 occur where the value is not +1. For example, template 242 has a value of +1 in the vicinity of 180 degrees, and −1 in the vicinity of 270 degrees.

Graph 250 is a product waveform 252, obtained by multiplying each point of spectrum 232 by a corresponding point of template 242. For example, as indicated in FIG. 2C, at an index k=1, spectrum 232 (i.e., graph 230) has a value of 4.3, and template 242 (i.e., graph 240) has a value of +1. Accordingly, product waveform 252 (i.e., graph 250) has a value of:

4.3=4.3×1.

Note that some points of product waveform 252 have negative values. This is due to an imperfect alignment of spectrum 232 with template 242. The width of the peaks of spectrum 232 is not precisely 90 degrees, and their positioning is not precisely symmetrical around the multiples of 180 degrees in graph 230.

For convenience hereinafter, we refer to a magnitude of a cepstral component corresponding to a power line or doubled power line frequency as a "PD score." In the context of product waveform 252, the PD score is found by summing the points of product waveform 252, and is equivalent to integrating a net area under product waveform 252.

$$PD = \sum_{k=1}^{M} S_k(\varphi)T_k(\varphi) = \sum_{k=1}^{M} P_k(\varphi),$$

where $S_k(\phi)$ is the $k^{th}$ value of spectrum 232, $T_k(\phi)$ is the $k^{th}$ value of template 242, and $P_k(\phi)$ is the $k^{th}$ value of product waveform 252. For product waveform 252:

PD=4.3+10.5+. . . +14.6+13.4=2559.8.

The triggering source for the spectrum analyzer will generally not be synchronized with the center of the PD spectral peaks. Therefore, in practice, the PD score is calculated a number of times, for a set of templates that have different initial phases, and thereafter, the highest PD score is selected as an indicator of PD level.

Figure 3A:
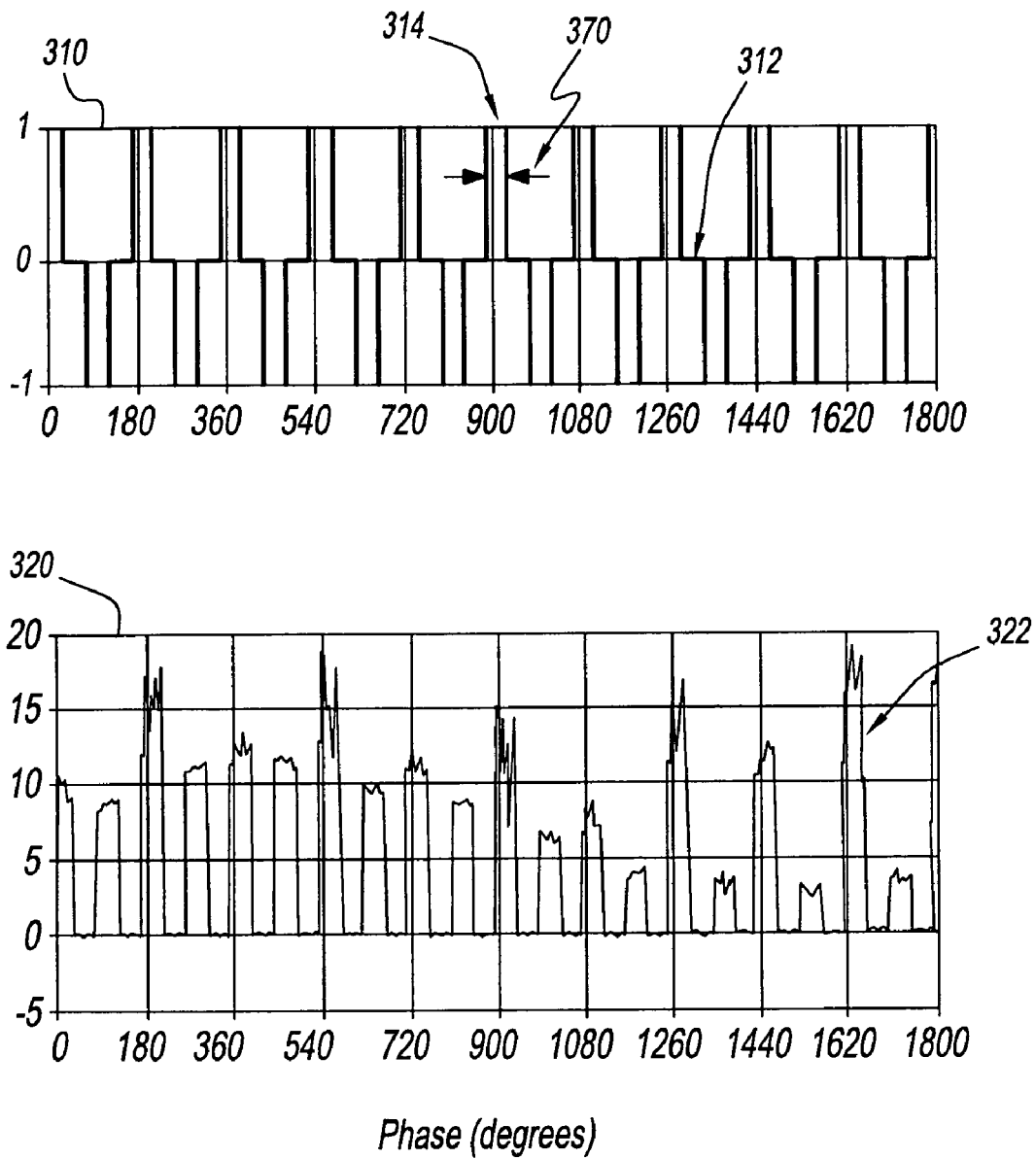
FIG. 3A is a set of graphs that illustrate a use of a template, as an alternative to a template discussed in the context of FIGS. 2A-2C.

FIG. 3A is a set of graphs, namely graphs 310 and 320, that illustrate a use of another template, as an alternative to template 242.

Graph 310 is a template 314 that, similarly to template 242, is symmetrical around zero, and has a net area of zero, but unlike template 242 includes intervals of zero values, for example at point 312, and so, has narrower regions of +1 values, and narrower regions of −1 values.

Graph 320 is a product waveform 322 that results from template 310 being applied against spectrum 232. Graph 320, as compared to product waveform 252, has zero values in phase regions that are not near integer multiples of 180 degrees.

Thus, template 314 minimizes the effects of alignment imperfection to which template 242 is susceptible. Template 314 desensitizes the PD score from variability of the width of spectral peaks 226, and incidentally, also causes the PD score to completely ignore any ingress corresponding to frequencies where template 314 has a zero value.

Figure 3B:
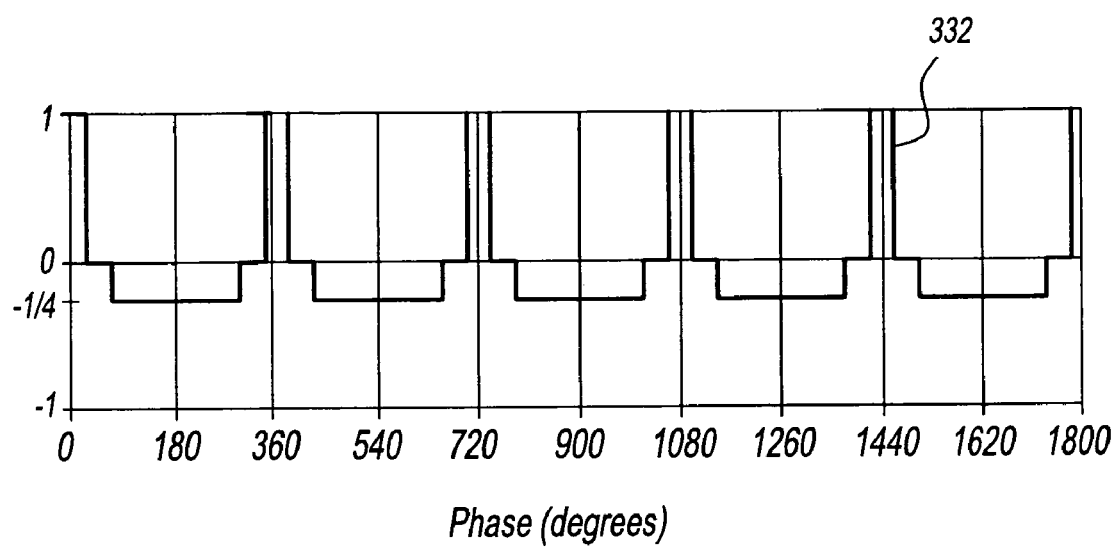
FIG. 3B is graph of a template having a periodicity of 360 degrees.

FIG. 3B is graph of a template 332. Template 332 has a net area of zero, and a periodicity of 360 degrees. That is, template 332 has values of +1 occurring in the vicinity of integer multiples of 360 degrees.

Referring back to FIG. 3A, note that template 314 is periodic, with a period corresponding to 180 degrees of a power voltage. That is, template 314 has a period that corresponds to one half of the period of the power voltage. In contrast, template 332 has a period that corresponds to the period of the power voltage. In a comparison of template 314 and template 332, template 314 produces a large PD score for PD firing every half cycle of the power voltage, while template 332 produces a large PD score for PD firing every full cycle.

In contrast with high PD scores calculated from processing spectra that have clear PD, noisy spectra of similar peak magnitudes yield much lower PD scores. This is because the spectral lines due to noise are random relative to power line phase.

Figure 4:
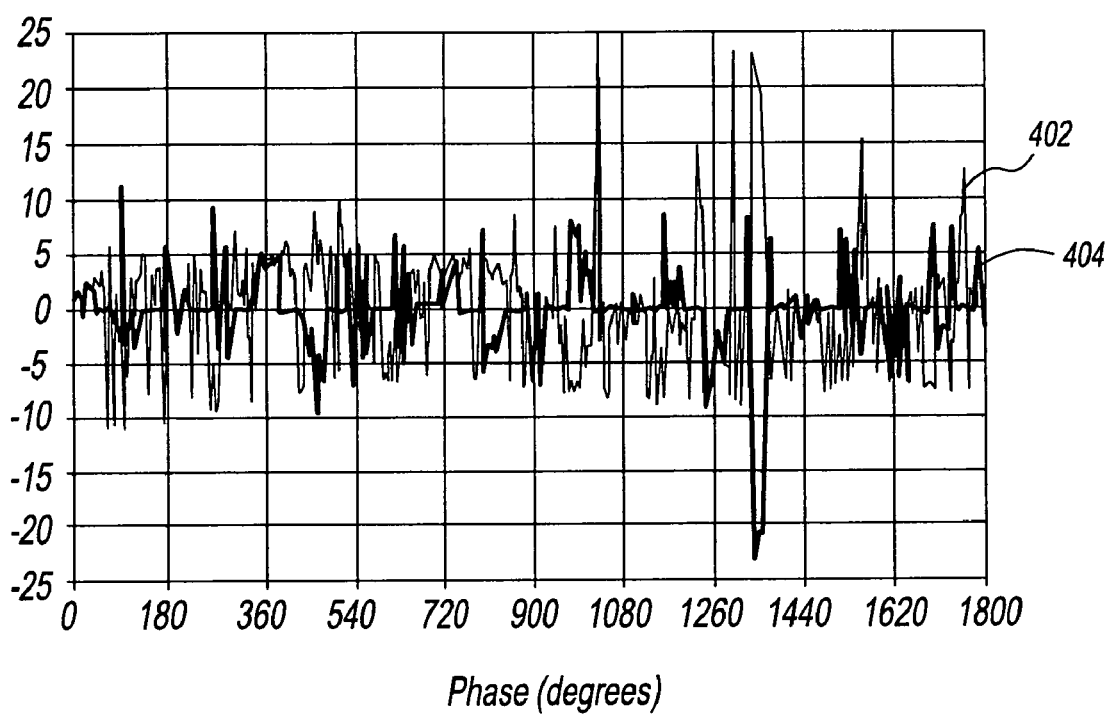
FIG. 4 is a graph of a noisy spectrum and a product waveform.

FIG. 4 is a graph of a noisy spectrum 402 (designated by a fine line) and a product waveform 404 (designated by a heavy line). Noisy spectrum 402 does not include PD. For example, noisy spectrum 402 could be produced by applying a noise signal to cable 105, where the noise signal magnitude is lower than a PD onset voltage. A spectrum analyzer displays noisy spectrum 402, after being centered on zero on the vertical scale. Product waveform 404 was produced by multiplying noisy spectrum 402 with template 314, and yields a PD score of −57. The calculation of this PD score is not shown herein, but it is obtained in a manner similar to that shown for the calculation of the PD score for product waveform 252.

Recall that product waveform 252 yields a PD score of 2559.8, and that product waveform 404 yields a PD score of −57. Thus, an environment in which PD is present (i.e., product waveform 252) yields a substantially higher PD score than an environment in which PD is not present (i.e., product waveform 404).

A further refinement may increase the certainty that a high PD score is due to PD and not ingress. For this refinement, the PD score is measured again for a set of slightly different start and stop frequencies of the spectrum analyzer. If this measurement yields another high PD score, it reinforces a conclusion that there is PD or other line-synchronized noise present on cable 105.

The width of the spectral lines represents additional information that can be derived from the acquired spectra. Some PD generators, especially those representing new PD sources, may have discharge occurring within a narrow range of phase angles, such as in a close vicinity of the peak of the power voltage. Other generators may have discharge over a broad range of phases. Thus, the width of spectral peaks indicates a condition of a power line.

Figure 4A:
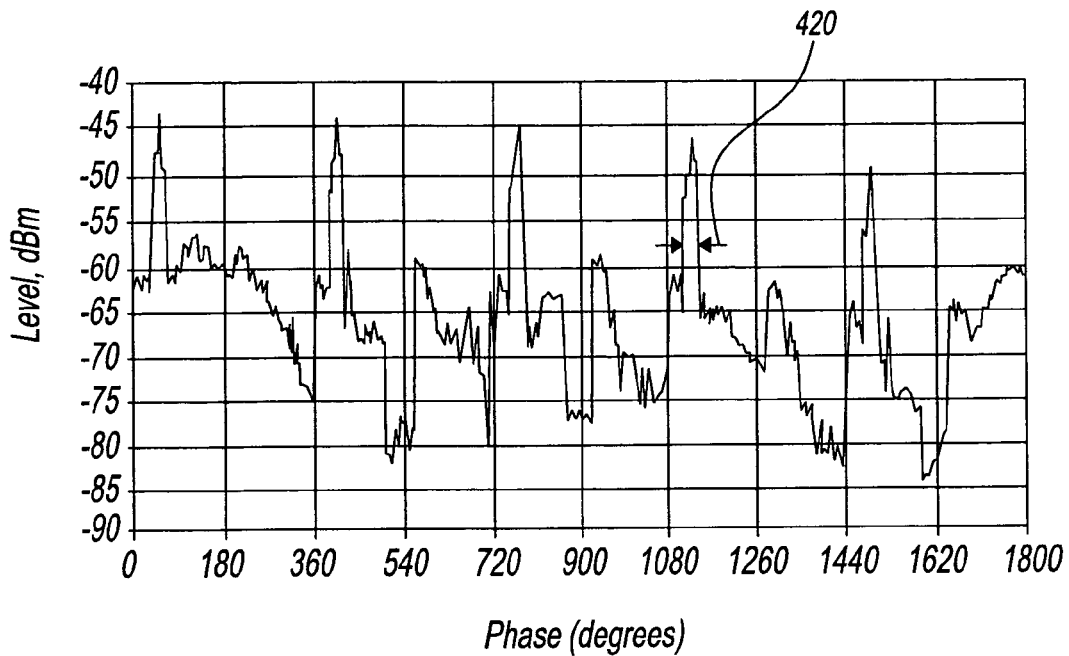
FIGS. 4A and 4B are graphs of line-triggered noise power spectra, having spectral peaks of different widths.
Figure 4B:
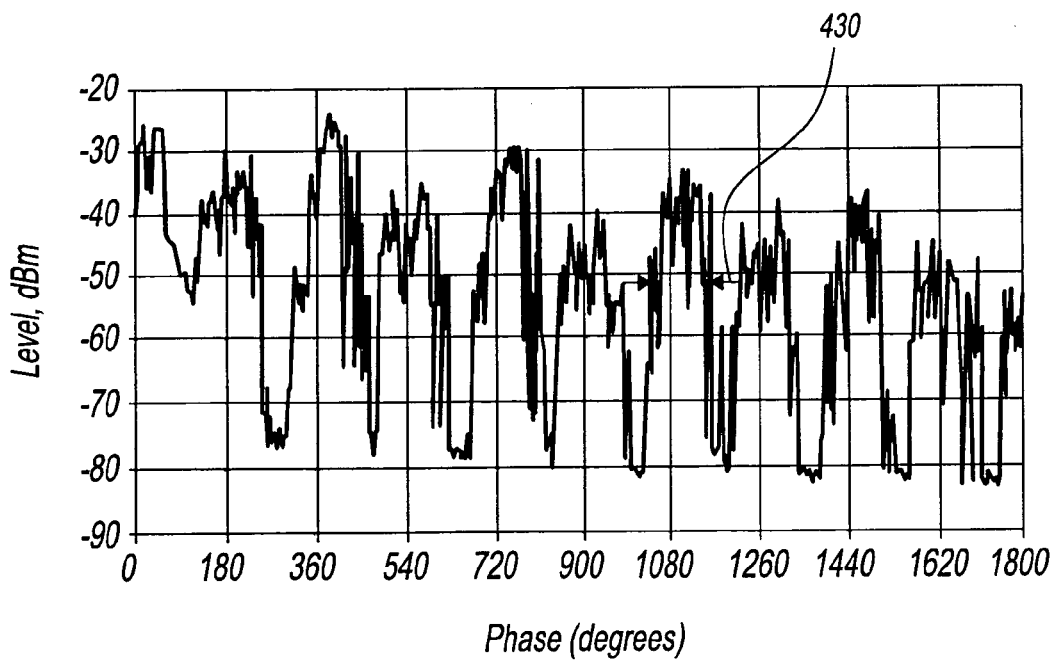

FIGS. 4A and 4B are graphs of line-triggered noise power spectra having different widths of spectral peaks. FIG. 4A shows a spectral peak having a width 420 of about 34 degrees, and FIG. 4B shows a spectral peak having a width 430 of about 133 degrees.

A template, and more specifically, a plurality of templates, can be used to quantify the width of the spectral peaks. For example, in template 314 (FIG. 3A), non-zero sections have a width 370. A plurality of templates similar to template 314 are created, where each of the plurality of templates has a different width 370. Thus, each of the plurality of templates has a different duty cycle. Each of the plurality of temples is then used to produce a product waveform (similar to the production of product waveform 252) that is then used to produce a PD score. The template whose duty cycle yields the highest PD score, is considered to have the width 370 that represents an approximation of the PD spectral line width.

Different physical mechanisms, or different PD sources, whose PD spectral components are generated during one polarity of the power voltage, may differ in magnitude from the PD generated during the other polarity. This condition is evidenced by a different PD magnitude for even multiples of 180 degrees than for odd multiples of 180 degrees.

For example, in FIG. 4A, the spectrum has a periodicity of about 360 degrees, close to even multiples of 180 degrees (e.g., at 360 degrees and 720 degrees) relative to a first peak at about 45 degrees after a trigger phase. Such periodicity indicates that PD discharges occur on mostly one polarity of the power voltage. A more moderate degree of dissimilarity between adjacent spectral peaks would be found in a case of discharges occurring on both of the positive and negative polarity of the power voltage.

Figure 4C:
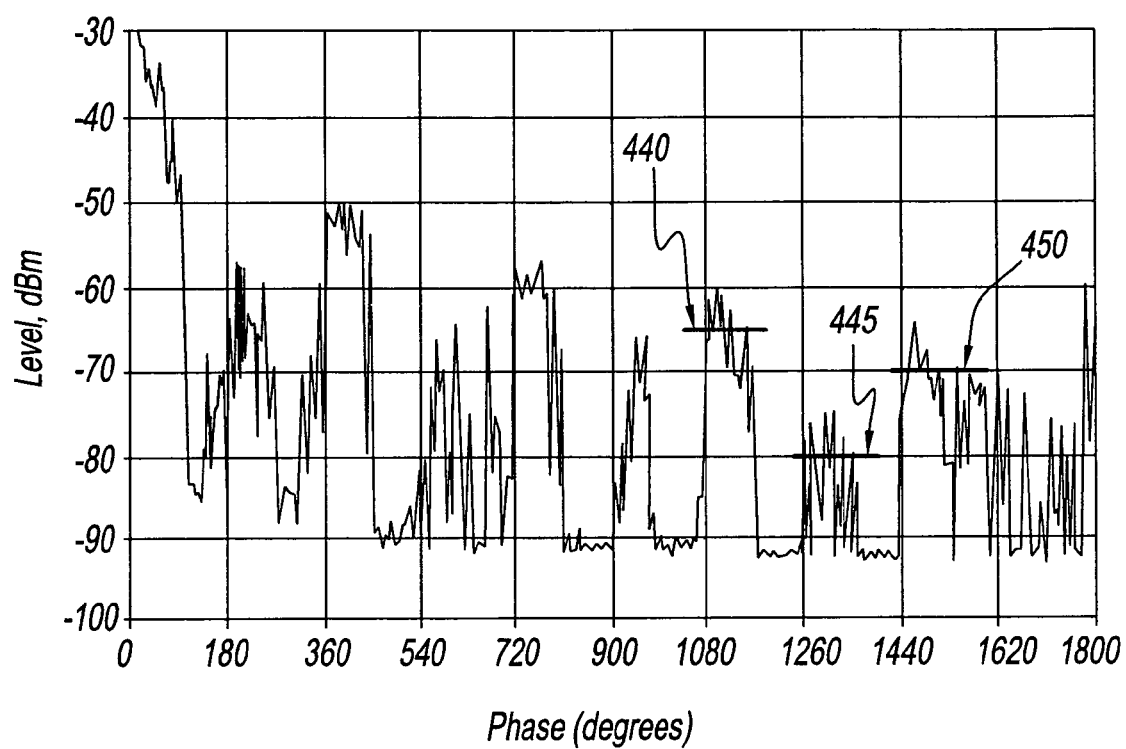
FIG. 4C is a graph of another line-triggered noise power spectrum.

FIG. 4C is a graph of another line-triggered noise power spectrum, which includes peaks 440, 445 and 450. Peak 445 has a magnitude of about −80 dBm, whilst neighboring peaks 440 and 450 have magnitudes of about −66 dBm and −70 dBm, respectively, i.e., a difference of about 10 to 14 dB from peak 445. While periodicity may be apparent in FIG. 4C, it is less apparent than in FIG. 4A.

A technique for quantifying the relationships between adjacent peaks is to first synthesize templates of 360 degree periodicity, whose initial phases are slightly varied from each other, and calculate PD scores using each template, until the phase is found that produces the highest PD score. This phase is noted as an optimum initial phase. Then, a new template is synthesized with 360 degree periodicity, but with its initial phase shifted by 180 degrees from the previously detected optimum phase. Using the new template, a new PD score is calculated, and a deviation of a ratio of the two Scores from unity is termed "PD asymmetry," a further useful parameter for quantifying PD. A ratio of magnitudes of alternating components indicates a condition of the power line.

Further information may be gleaned from the PD signals, with regard to the distance of the PD from the detector location. For example, underground cables tend to attenuate high frequency signals more than low frequency signals, so a downward trend of the frequency spectrum is an indication that the PD source may be distant from the sensing location.

Assume that the line-triggered noise spectrum is measured at a particular point on a power line, and that the line-triggered noise spectrum has a low frequency (e.g., 5 MHz) spectral component and a high frequency (e.g., 16 MHz) spectral component. If the magnitude of high frequency component is approximately equal to the magnitude of the low frequency component, then the source of PD is likely to be near the point on the power line at which the spectrum is being measured. If the magnitude of high frequency component is less than the magnitude of the low frequency component, then the source of PD is likely to be remote from the point on the power line at which the spectrum is being measured. Moreover, given knowledge of the cable's attenuation of a signal as a function of frequency and cable length, the difference in magnitude over frequency can be used to estimate a distance of the PD source from the point on the power line at which the spectrum is being measured.

PD detector 130 is contemplated as being able to perform any of the techniques for detecting PD described herein. Nevertheless, below, there is presented several exemplary embodiments of PD detector 130.

Figure 5:
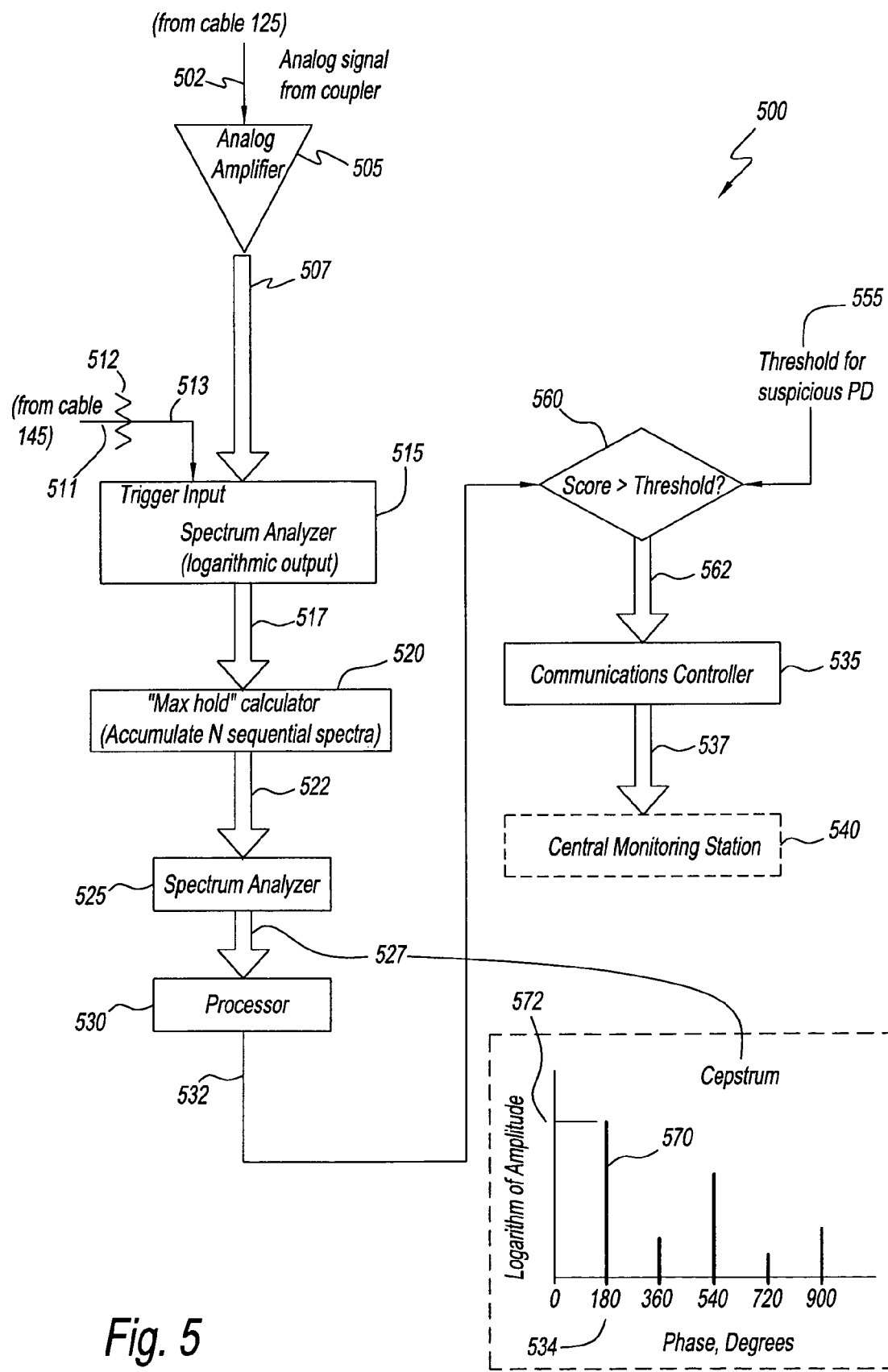
FIG. 5 is a functional block diagram of a PD detector.

FIG. 5 is a functional block diagram of a PD detector 500. PD detector 500 is an exemplary embodiment of PD detector 130, and includes an analog amplifier 505, an attenuator 512, a spectrum analyzer 515, a max hold calculator 520, a spectrum analyzer 525, a processor 530, a comparator 560, and a communications controller 535. PD detector 500 receives a power line signal 502, e.g., from the secondary of coupler 120 via cable 125 (see FIG. 1), and a low voltage at power frequency, i.e. a power frequency voltage 511, e.g., from secondary 140 via cable 145 (see FIG. 1).

PD detector 500 determines a characteristic, e.g., a magnitude, of a fundamental spectral component of a spectrum of a power spectrum of noise on a power line, and determines a condition of the power line, e.g., a presence of PD, based on the characteristic.

Analog amplifier 505 receives and amplifies power line signal 502, and outputs an amplified analog signal 507.

Attenuator 512 receives power frequency voltage 511, attenuates power frequency voltage 511, and outputs a phase reference voltage 513.

Spectrum analyzer 515 receives phase reference voltage 513 and amplified analog signal 507. Spectrum analyzer 515 uses phase reference voltage 513 as a trigger, and so, is triggered at a constant phase of phase reference voltage 513. The phase of phase reference voltage 513 is essentially constant relative to the power voltage on cable 105. The phase of PD pulses on cable 125 is closely related to the phase of the power voltage on cable 105. Thus, phase reference voltage 513 is a reference phase for analyzing PD. Hence, spectrum analyzer 515 acquires a power spectrum of noise on cable 105 during a sweep of a range of frequencies that is triggered with respect to a phase of a power voltage on cable 105. Spectrum analyzer 515 outputs a logarithmic value of an amplitude of each spectral line, thus providing a line-synchronized power spectrum, i.e., a spectrum 517, of noise on cable 105.

Spectrum analyzer 515 can be implemented as a conventional spectrum analyzer, or as a bandpass filter whose center frequency is swept between a start frequency and a stop frequency, or as a superheterodyne receiver whose local oscillator frequency is swept between a start frequency and a stop frequency.

Max hold calculator 520 receives spectrum 517. As mentioned above, PD spectral lines may appear sporadically, therefore, max hold calculator 520 accumulates a set of the highest values of spectrum 517 measured over one or more frequency sweeps, e.g., 1 to 7 sweeps, of spectrum analyzer 515. Accordingly, max hold calculator 520 calculates a "max hold" value for each of the spectral lines in spectrum 517, and yields a max hold spectrum, i.e., a spectrum 522. Thus, spectrum 522 is a max hold version of the power spectrum of noise on cable 105, e.g., see spectrum 227 in FIG. 2A.

Spectrum analyzer 525 receives spectrum 522. When PD or other line-synchronized megahertz noise is present, spectrum 522 will have considerable periodicity, corresponding to the line frequency (360 degrees) or twice the line frequency (180 degrees). To analyze this periodicity, spectrum analyzer 525 produces data representing a cepstrum of power line signal 502, i.e., cepstral data 527. Thus, cepstral data 527 represents a spectrum of a power spectrum of noise on cable 105.

Processor 530 receives cepstral data 527, and ranks the magnitudes of cepstral components. Processor 530 determines the phase 534 of a strongest fundamental spectral component 570 of cepstral data 527, and also determines the fundamental spectral component (e.g. 360 degrees, 180 degrees, or neither). If PD is present on cable 105, the fundamental frequency component will have a phase equal to either of (a) 360 degrees, corresponding to a frequency of a power voltage on the power line, or (b) 180 degrees, corresponding to twice the frequency of the power voltage. The magnitude of the stronger of the two components is designated as the PD score. Processor 530 outputs a report 532 that includes the PD score, and the identity of phase 534, i.e. which of the two cepstral components, 180 degrees or 360 degrees, is present.

Comparator 560 receives report 532, which includes the PD score, and compares the PD score to a threshold 555. Threshold 555 is a value set above a level that represents background noise and ingress. If the PD score is greater than threshold 555, then PD is present. If the PD score is not greater than threshold 555, then PD is not present. Comparator 560 outputs a report 562 that includes either the PD score and the identity of phase 534, or an indication that no PD is present.

Communications controller 535 receives report 562, and transmits a report 537 to a central monitoring station 540. Report 537 includes either the PD score, or alternatively, an indication that no PD is present.

Central monitoring station 540 is represented as a box having a dashed line for a perimeter because central monitoring station 540 is not part of PD detector 500, but is instead, separate from PD detector 500. Central monitoring station 540 receives report 537 and maintains a history of PD scores from system 500. Central monitoring station 540 also evaluates the PD scores over time, and if there is a change in the PD scores, or if a PD score exceeds a particular value, central monitoring station 650 will recommend corrective action.

Figure 6:
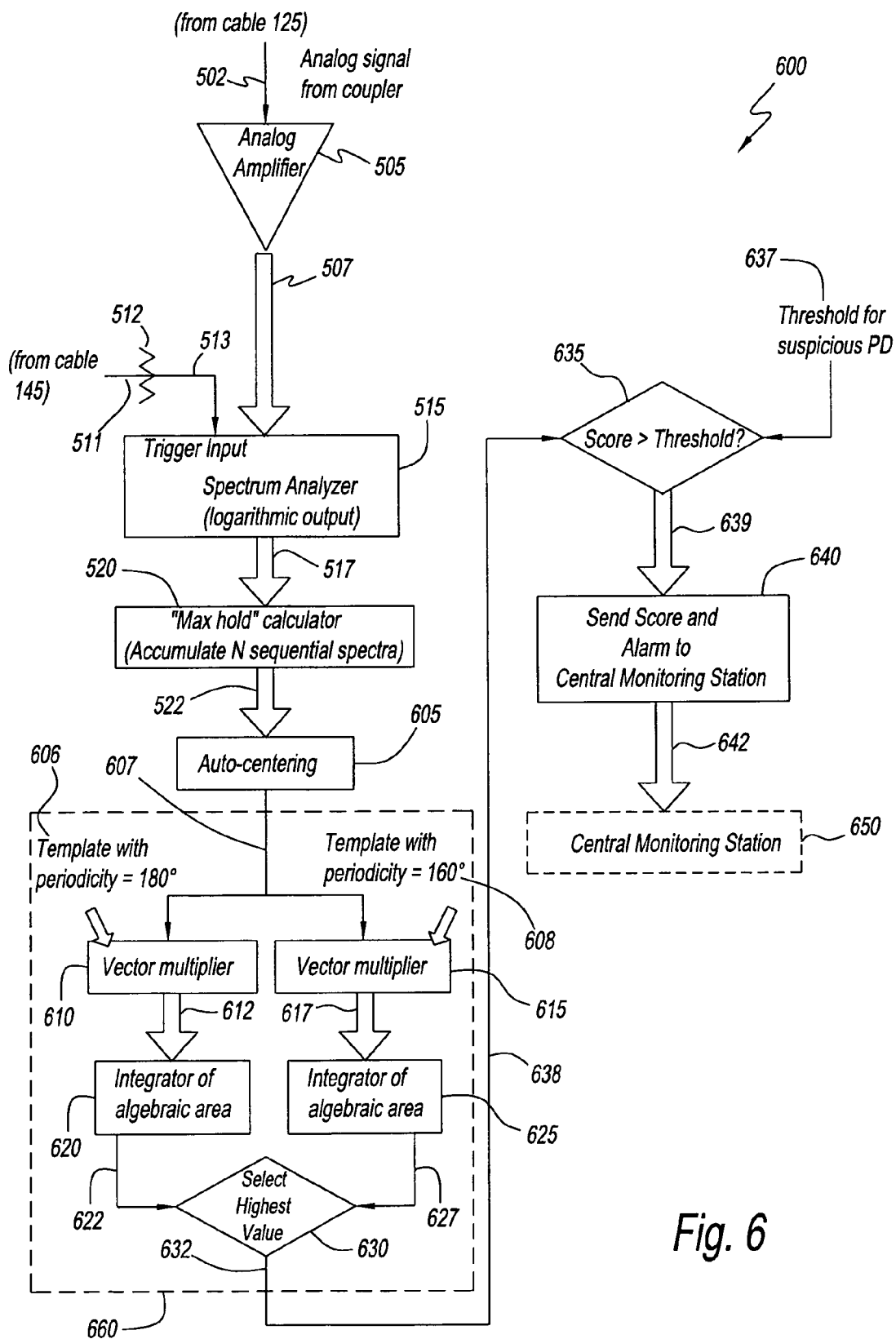
FIG. 6 is a functional block diagram of another PD detector.

FIG. 6 is a functional block diagram of a PD detector 600, which is another exemplary embodiment of PD detector 130. PD detector 600, similarly to PD detector 500, includes an analog amplifier 505, an attenuator 512, a spectrum analyzer 515, and a max hold calculator 520, all of which function as described for PD detector 500. Additionally, PD detector 600 includes an auto-centering module 605, vector multipliers 610 and 615, integrators 620 and 625, a selector 630, a comparator 635, and a communications controller 640. As in PD detector 500, max hold calculator 520 outputs a spectrum 522.

PD detector 600, similarly to PD detector 500, determines a characteristic, e.g., a magnitude, of a fundamental spectral component of a spectrum of a power spectrum of noise on a power line, and determines a condition of the power line, e.g., a presence of PD, based on the characteristic. However, PD detector 600 does not obtain the fundamental spectral component in the same manner as PD detector 500.

Auto-centering module 605 receives spectrum 522, which is a max hold version of the power spectrum of noise on cable 105, and zero centers spectrum 522 to yield a zero-centered spectrum 607, e.g., see spectrum 232.

Vector multiplier 610 receives spectrum 607, and a template 606 having a periodicity of 180 degrees (e.g., see template 314). Vector multiplier 610 multiplies each point in spectrum 607 by a corresponding point in template 606. If template 606 is composed of values of only 0, +1 and −1, the multiplications performed by vector multiplier 610 either yield a product of 0, or are simply replicas or sign inversions of values in spectrum 607. Vector multiplier 610 outputs a product waveform 612.

Vector multiplier 615 receives spectrum 607, and a template 608 having a periodicity of 360 degrees (e.g., see template 332). Vector multiplier 615 multiplies each point in spectrum 607 by a corresponding point in template 608. If template 608 is composed of values of only 0, +1 and −1, the multiplications performed by vector multiplier 615 either yield a product of 0, or are simply replicas or sign inversions of values in spectrum 607. Vector multiplier 615 outputs a product waveform 617.

Integrator 620 receives product waveform 612, and integrates the area under product waveform 612. The integration can be obtained by summing the points of product waveform 612. Integrator 620 outputs a candidate PD score 622.

Integrator 625 receives product waveform 617, and integrates the area under product waveform 617. The integration can be obtained by summing the points of product waveform 617. Integrator 625 outputs a candidate PD score 627.

Selector 630 compares candidate PD score 622 to candidate PD score 627. As mentioned above, during the discussion of FIG. 3C, a template whose period is 180 degrees produces a large PD score for PD firing every half cycle of the power voltage, while a template whose period is 360 degrees produces a large PD score for PD firing every full cycle. Accordingly, candidate PD score 622 will be greater than candidate PD score 627 for PD firing every half cycle of the power voltage, while candidate PD score 627 will be greater than candidate PD score 622 for PD firing every full cycle. Selector 630 selects the greater of candidate PD score 622 and candidate PD score 627, and outputs the selected candidate PD score as the PD score in a report 632.

Collectively, vector multipliers 610 and 615, integrators 620 and 625, and selector 630, in an arrangement 660 designated by a dashed line, determine a magnitude (represented by the PD score) of a fundamental spectral component, e.g., 180 degrees or 360 degrees, of a spectrum of the power spectrum of noise on cable 105. That is, vector multipliers 610 and 615 effectively serve to extract the fundamental spectral component of a spectrum of spectrum 607, and integrators 620 and 627 provide the magnitude value (represented by PD score). More generally, arrangement 660 determines a characteristic, e.g., magnitude, of the fundamental spectral component of a spectrum of a power spectrum of noise on a power line, e.g., cable 105.

The state of selector 630 represents an indication as to which of the two possible fundamental spectral components, 180 or 360 degrees, is the strongest. This information is also included in report 632.

Comparator 635 receives report 632, which includes the PD score, and compares the PD score to a threshold 637. Threshold 637 is a value set above a level that represents background noise and ingress. If the PD score is greater than threshold 637, then PD is present. If the PD score is not greater than threshold 637, then PD is not present. Comparator 635 outputs a report 639 that includes either the PD score and the identity of the strongest fundamental phase component, or an indication that no PD is present.

Communications controller 640 receives report 639, and transmits a report 642 to a central monitoring station 650. Report 642 includes either the PD score and the phase of the strongest fundamental spectral component (180 or 360 degrees), or alternatively, an indication that no PD is present.

Central monitoring station 650 is represented as a box having a dashed line for a perimeter because central monitoring station 650 is not part of PD detector 600, but is instead, separate from PD detector 600. Central monitoring station 650 receives report 642 and maintains a history of PD scores 632 from system 600. Central monitoring station 650 also evaluates PD scores 632 over time, and if there is a change in PD scores 632, or if PD score 632 exceeds a particular value, central monitoring station 650 will recommend corrective action.

In an alternative implementation of a PD detector, spectrum 517 is transmitted to a central location from equipment located at different locations, and all calculations and analyses are carried out at a central processor. So, for example, with reference to FIG. 5, functions performed by max hold calculator 520, spectrum analyzer 525 processor 530, integrator 550, and comparator 560 would be performed by the central processor. Similarly, with reference to FIG. 6, functions performed by auto-centering module 605, vector multipliers 610 and 615, integrators 620 and 625, selector 630, and comparator 635 would be performed by the central processor.

Figure 7:
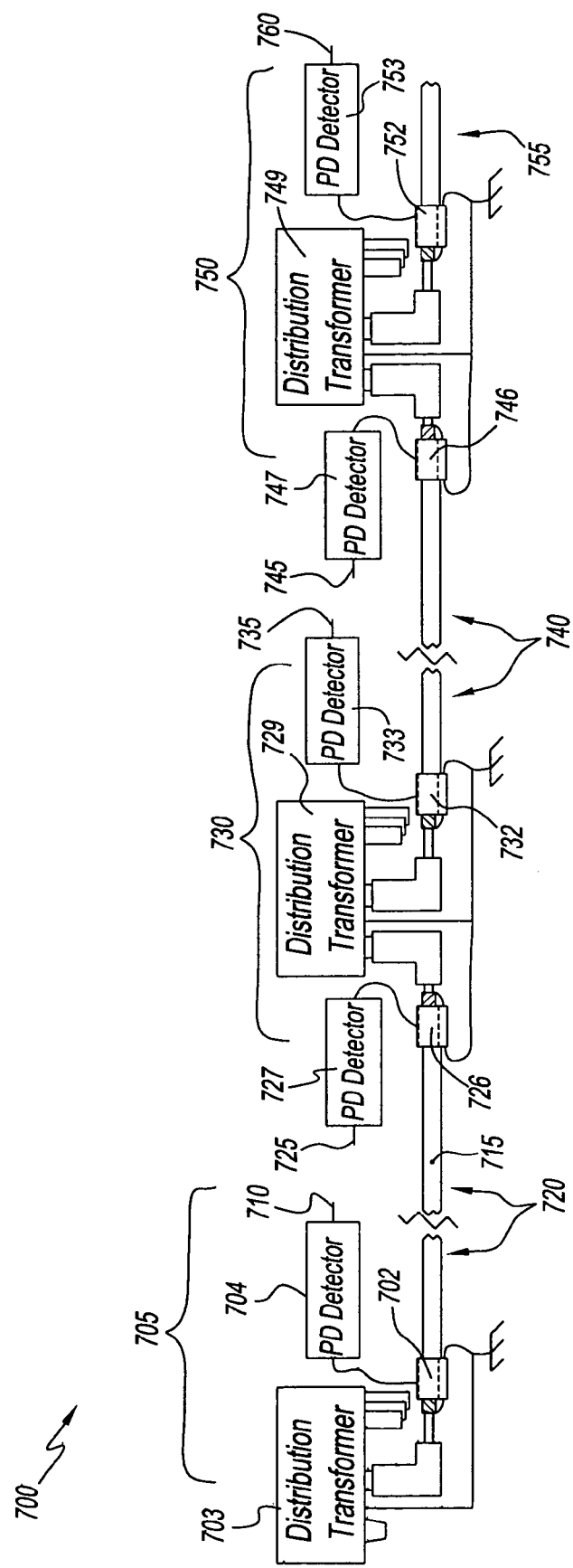
FIG. 7 is an illustration of a portion of a power distribution system that includes a network of couplers and communications nodes deployed at most or all distribution transformers in a neighborhood, configured to detect PD at a plurality of locations.

FIG. 7 is an illustration of a portion of a power distribution system 700 that includes a network of couplers configured to detect PD at a plurality of locations. System 700 includes distribution transformers 703, 729 and 749, power cables 720, 740 and 755, couplers 702, 726, 732, 746 and 752, and PD detectors 704, 727, 733, 747 and 753. Distribution transformer 703, coupler 702 and PD detector 704 are arranged at a location 705. Distribution transformer 729, couplers 726 and 732, and PD detectors 727 and 733 are arranged at a location 730. Distribution transformer 749, couplers 746 and 752 and PD detectors 747 and 753 are arranged at a location 750. Primaries of distribution transformer 703, 729 and 749 are fed by cables 720, 740 and 755 arranged in a string, with power being supplied from cable 755.

Distribution transformer 729 receives power from power cable 740, and passes power downstream via power cable 720. Each of couplers 726 and 732 is connected to a single communications node (not shown) configured as a repeater. Such a node may incorporate both of PD detectors 727 and 733. PD detectors 727 and 733 each provide a PD score, with the higher PD score or other PD parameter indicating from which direction the PD noise is arriving.

PD noise at location 715 originating in power cable 720 may propagate over power cables 720, 740 and 755, and may cause PD scores to rise at locations 705, 730 and 750. A comparison of a relative increase in PD scores between outputs 710, 725, 735, 745 and 760 provides information on the most likely general location of the PD source.

A monitoring station (not shown in FIG. 7) records a history of PD scores for multiple locations, and determines which cable or device is the most likely damaged, based on an assumption that closer damage is to a coupler, the higher the PD level. The PD level also indicates the urgency of a site visit, for pre-emptive maintenance.

In system 700, since PD detectors 704, 727, 733, 747 and 753 are each at a different location, system 700 obtains an indication of a power line condition detected at each of the plurality of locations. The PD scores are communicated to the monitoring station, i.e., a central location, which compares the indications of the power line condition detected at each of the plurality of locations to determine a most probable location for a source of partial discharge.

As explained above, the detection of PD involves spectral analysis of a power line signal across a frequency range, corresponding to a phase range of 0 to N times 360 degrees. However, a sweep of the frequency range by a spectrum analyzer is relatively slow, and so, if the spectrum analyzer acquires spectral components over a broad range of frequencies, the spectral components are likely to have been caused by a plurality of discharges. Consequently, a comparison of spectral components acquired by a single spectrum analyzer implicitly assumes that all discharges are equivalent to each other. In practice, however, this equivalence is only approximate, at best, and may not hold accurately for an entire sweep, much less a plurality of sweeps.

Figure 8:
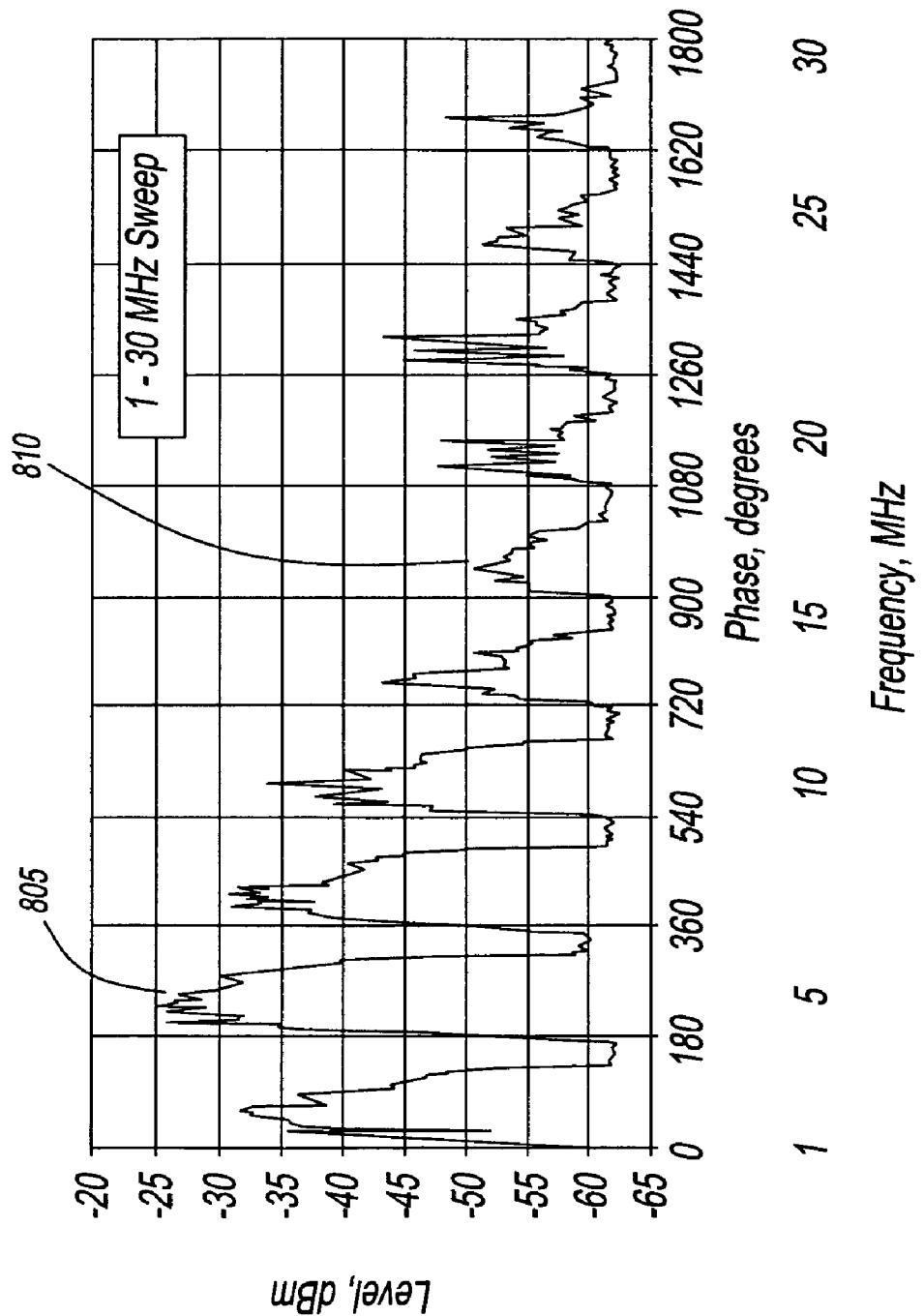
FIG. 8 is a graph of a line-triggered noise spectrum over a frequency of 1 MHz-30 MHz

FIG. 8 is a graph of a line-triggered noise spectrum over a frequency of 1 MHz-30 MHz, as acquired over a period of 1800 degrees of a power voltage waveform. There is a spectral component 805 at about 5 MHz, and a spectral component 810 at about 16 MHz. Spectral component 805 was acquired at a phase of about 250 degrees, and spectral component 810 was acquired at a phase of about 970 degrees. That is, spectral component 805 was acquired during a first period of the power voltage waveform after a trigger, and spectral component 810 was acquired during a third period of the power voltage waveform after the trigger. Thus, the partial discharge that generated spectral component 805 is not the same partial discharge that generated spectral component 810. There is no guarantee that the characteristics of the partial discharge that generated spectral component 805 are the same as the characteristics of the partial discharge that generated spectral component 810. Consequently, a comparison of the magnitudes of spectral components 805 and 810 cannot be performed with a high level of confidence that the comparison will yield a valid result.

Comparisons of PD detected at different locations will be more accurate, if each is based on the same set of discharges. Therefore, it is advantageous to synchronize the triggers of the sweeps of all PD detectors on a given feeder, and to accumulate the same number of sweeps at all detectors. When the detectors are part of a communications network, such synchronization may be accomplished by the network.

As mentioned above, a partial discharge generates a broad band of noise, and therefore, an individual partial discharge includes spectral components throughout a wide range of frequencies. For example, a single partial discharge would typically generate noise that includes a spectral component in the vicinity of 5 MHz, and simultaneously includes a spectral component in the vicinity of 16 MHz. Therefore, if two spectrum analyzers are employed such that one of the spectrum analyzers is sweeping in the range of 1 MHz, and simultaneously, the other spectrum analyzer is sweeping in the range of 25 MHz, each of the two spectrum analyzers will capture a portion of the noise generated by the same single partial discharge.

Figure 9A:
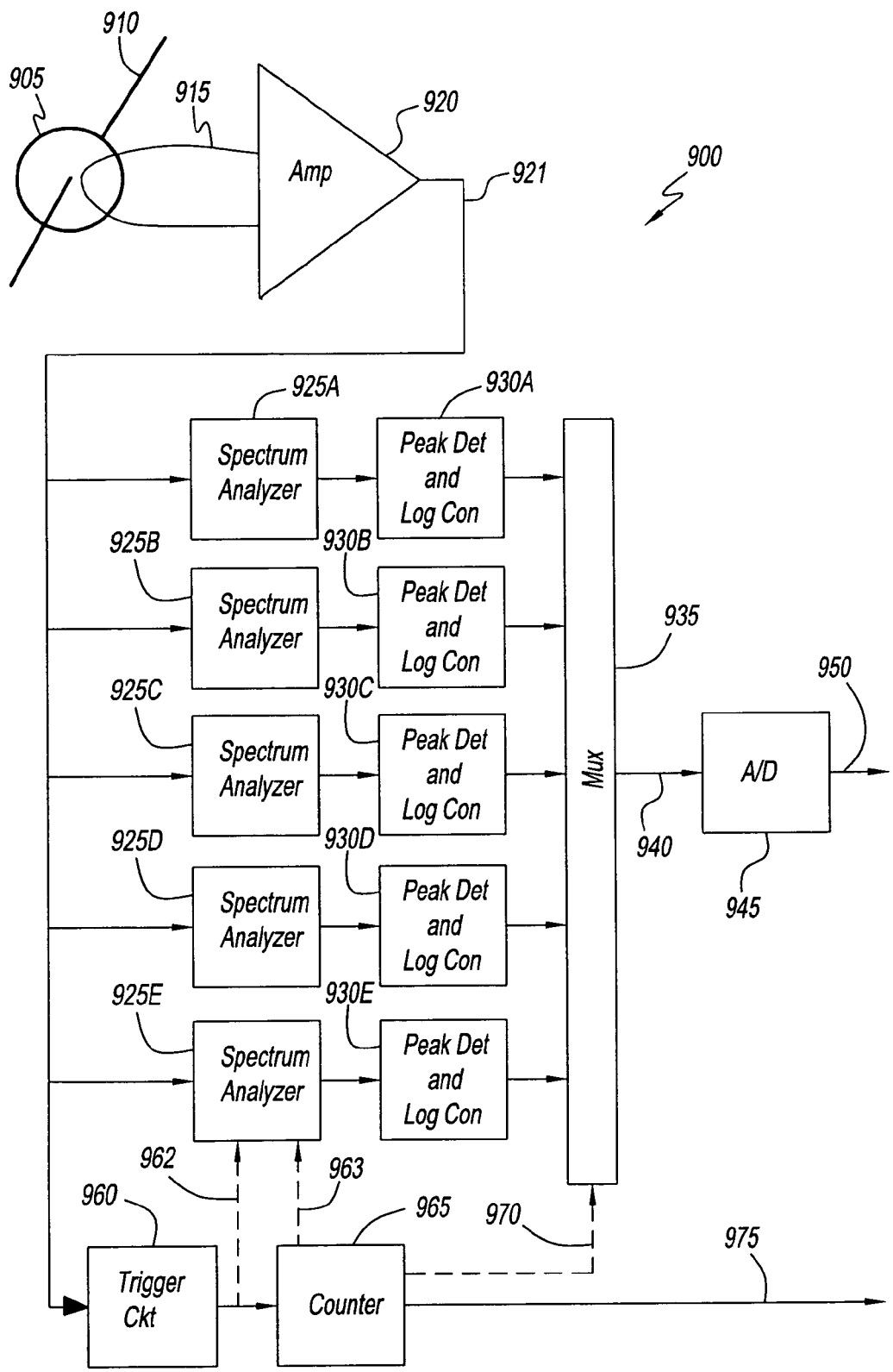
FIGS. 9A and 9B are block diagrams of a system for measuring PD over a broad frequency range.

FIG. 9A is a block diagram of a system 900 for measuring PD over a broad frequency range. System 900 includes a coupler 905, a low noise preamplifier, e.g., an amplifier 920, five spectrum analyzers 925A-925E, five peak detectors and logarithmic converters 930A-930E, an analog multiplexer 935, and an analog-to-digital converter (A/D) 945. System 900 also includes a line frequency trigger circuit 960, and counter 965.

Coupler 905 is situated on a power line 910. A winding 915 from coupler 905 is connected to amplifier 920.

Amplifier 920 receives, via winding 915, a signal derived from signals on power line 910. Amplifier 920 amplifies the signal from winding 915, and provides a signal 921 that includes a frequency component that corresponds to a frequency of the power voltage on power line 910, and also includes noise that is propagating along power line 910. Signal 921 is provided to each of spectrum analyzers 925A-925E, and to trigger circuit 960.

Trigger circuit 960 receives signal 921, and whereas signal 921 includes a frequency component that corresponds to a frequency of the power voltage on power line 910, trigger circuit 960 provides a trigger 962 that is synchronized to the power voltage on power line 910. Trigger 962 is provided to each of spectrum analyzers 925A-925E, and to counter 965.

Counter 965 receives trigger 962, which resets and starts a count of counter 965. Counter 965 outputs a count 963, a count 970 and a count 975. Count 963 is provided to each of spectrum analyzers 925A-925E. Count 970 is provided to analog multiplexer 935, and count 975 is provided to a processor (not shown), as explained below.

Each of spectrum analyzers 925A-925E receives signal 921, trigger 962, and count 963. Each of spectrum analyzers 925A-925E are triggered by trigger 962, and sweeps through a portion of a spectrum of signal 921. Count 963 controls the frequency sweep of each analyzer 925A-E, and controls the rate at which the sweeps progress. Thus, spectrum analyzers 925A-925E each cover a different frequency range, but are synchronous with one another, and sweep their respective ranges in parallel with one another.

For example, assume that we wish to analyze a spectrum of 1 MHz-30 MHz. Accordingly, spectrum analyzers 925A-925E sweep through frequencies as set forth in the following Table 1.

TABLE 1

Frequency Ranges of Sweeps of Spectrum Analyzers 925A-925E

| Spectrum Analyzer | Frequency Range |
|---|---|
| 925A | 1 MHz-6.8 MHz |
| 925B | 6.8 MHz-12.6 MHz |
| 925C | 12.6 MHz-18.6 MHz |
| 925D | 18.6 MHz-24.2 MHz |
| 925E | 24.2 MHz-30 MHz |

Collectively, spectrum analyzers 925A-925E cover the full spectrum of 1 MHz-30 MHz. The frequency bands swept by spectrum analyzers 925A-925E may be arranged sequentially to cover a complete range of frequencies, as shown in Table 1, or may skip some frequency ranges that are not of interest or that have particularly high levels of ingress noise.

The duration of each sweep corresponds to one cycle, i.e., 360 degrees, of the power voltage on power line 910. Thus, for a 60 Hz power voltage, the duration of each sweep is 16.6 milliseconds. Each of spectrum analyzers 925A-925E provides a spectral output.

Each discharge, in a cable suffering partial discharge, is extremely brief, on the order of one nanosecond, and the existence of its spectral energy is correspondingly brief. Spectrum analyzers 925A- 925E increment their respective frequencies stepwise, and dwell there for a relatively substantial period, e.g. 200 microseconds. A discharge may appear at any time during this dwell time, and a peak detector is required to capture the peak value of measurement, caused by this discharge.

Peak detectors and logarithmic converters 930A-930E receive the spectral outputs of spectrum analyzers 925A-925E, respectively, and calculate a logarithm of the spectral outputs. Each of peak detectors and logarithmic converters 930A-930E provides a logarithmic representation of the frequency swept by their respective spectrum analyzers 925A-925E.

Analog multiplexer 935, receives the outputs from peak detectors and logarithmic converters 930A-930E, and also receives count 965. Based on count 965, analog multiplexer 935 consecutively scans the outputs from peak detectors and logarithmic converters 930A-930E, and provides a multiplexed output 940.

A/D 945 receives multiplexed output 940, and converts the multiplexed output to a data output 950. Data output 950 represents five spectra, each of which corresponds to 360 degrees of the power voltage on power line 910.

Data output 950 is provided to a processor (not shown) that calculates PD parameters. Count 975 is communicated to the processor, together with data output 950, to identify from which analyzer and frequency range data output 950 originates. Count 975 is also indicative of the phase of the power voltage with which data output 950 is associated.

Figure 9B:
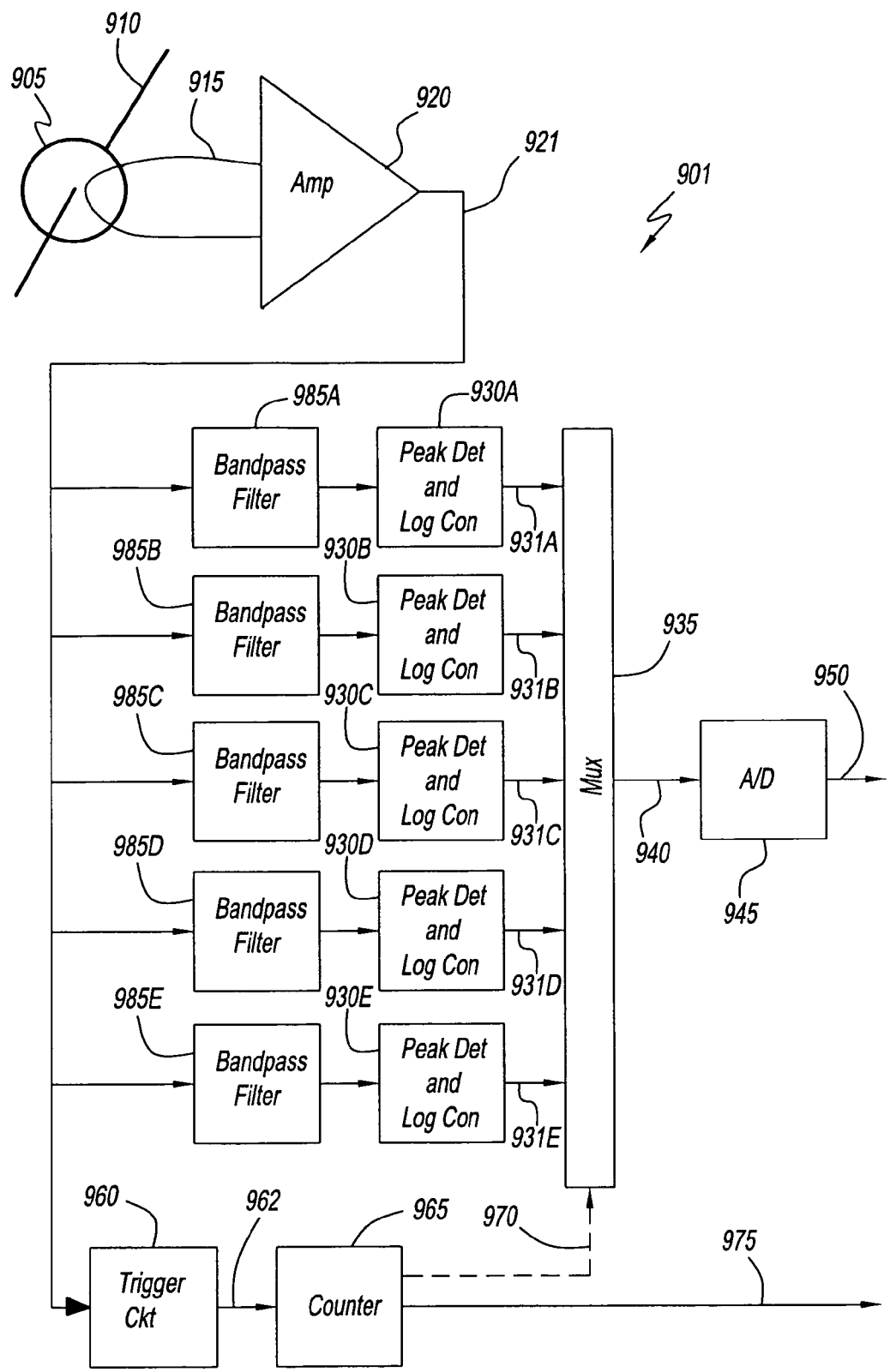

FIG. 9B is a block diagram of a system 901, which is another embodiment of a system for measuring PD over a broad frequency range. System 901 is similar to system 900, however where system 900 uses spectrum analyzers 925A-925E, system 901 uses a plurality of bandpass filters 985A-985E, to acquire discrete points of a power spectrum. Accordingly, in system 901, trigger 962 is provided only to counter 965, and counter 965 does not provide count 963.

As with system 900, count 975 is communicated to a processor (not shown), together with data output 950. Count 975 provides phase information so that points of data output 950 are recorded with respect to a phase of a power voltage on power line 910. Count 975 acts as a label to identify which filter and frequency range was the source of each particular data output 950, and is also indicative of the phase of the power voltage with which each particular data output 950 is associated.

Each bandpass filter 985A-985E is tuned to a different center frequency and has a wide bandwidth (e.g. 1 MHz). One or more bandpass filters (e.g., 985A) have low center frequencies for which power line 910 does not appreciably attenuate PD, while other bandpass filters (e.g., 985E) have high center frequencies for which attenuation per unit distance is significant. Frequency bands of bandpass filters 985A-985E are preferably chosen to avoid frequencies of known sources of ingress, such as broadcast stations.

Outputs 931A-931E of peak detectors and logarithmic converters 930A-930E represent an integration of the energy present in the filter passband. If little or no PD is present, outputs 931A-931E display a time variation that is small and random relative to a power frequency. When PD is present, outputs 931A-931E will include a component that is synchronous with the power frequency or twice the power frequency.

Since each of bandpass filters 985A-985E is tuned to a different center frequency, their respective outputs are measurements of five separate spectral components. In the presence of PD, data output 950 includes components synchronous with a phase of a power voltage on power line 910. Magnitudes of these components indicates a condition of a power line.

Figure 10:
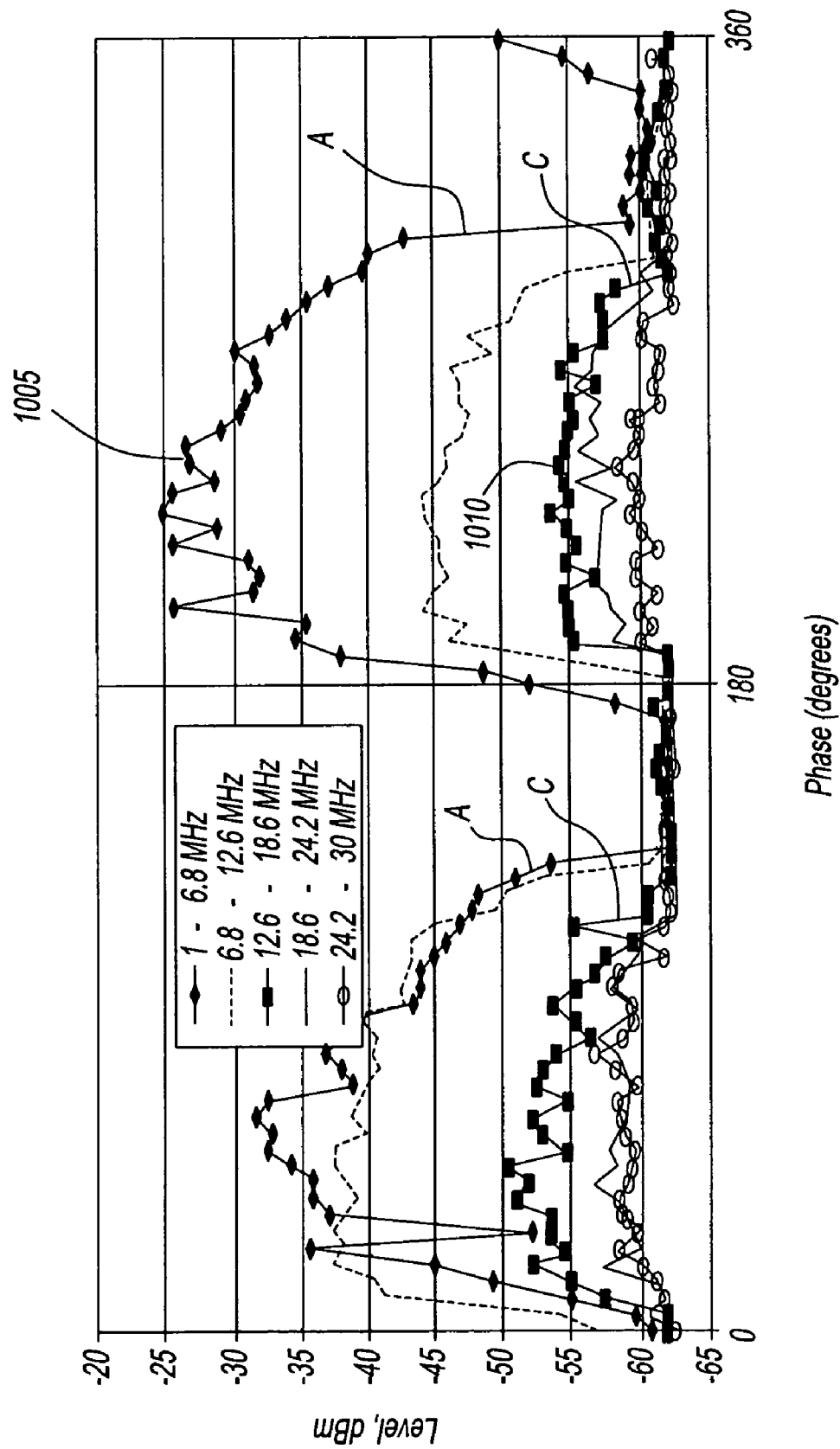
FIG. 10 is a graph of several spectra acquired by the system of FIG. 9A.
Figure 6:
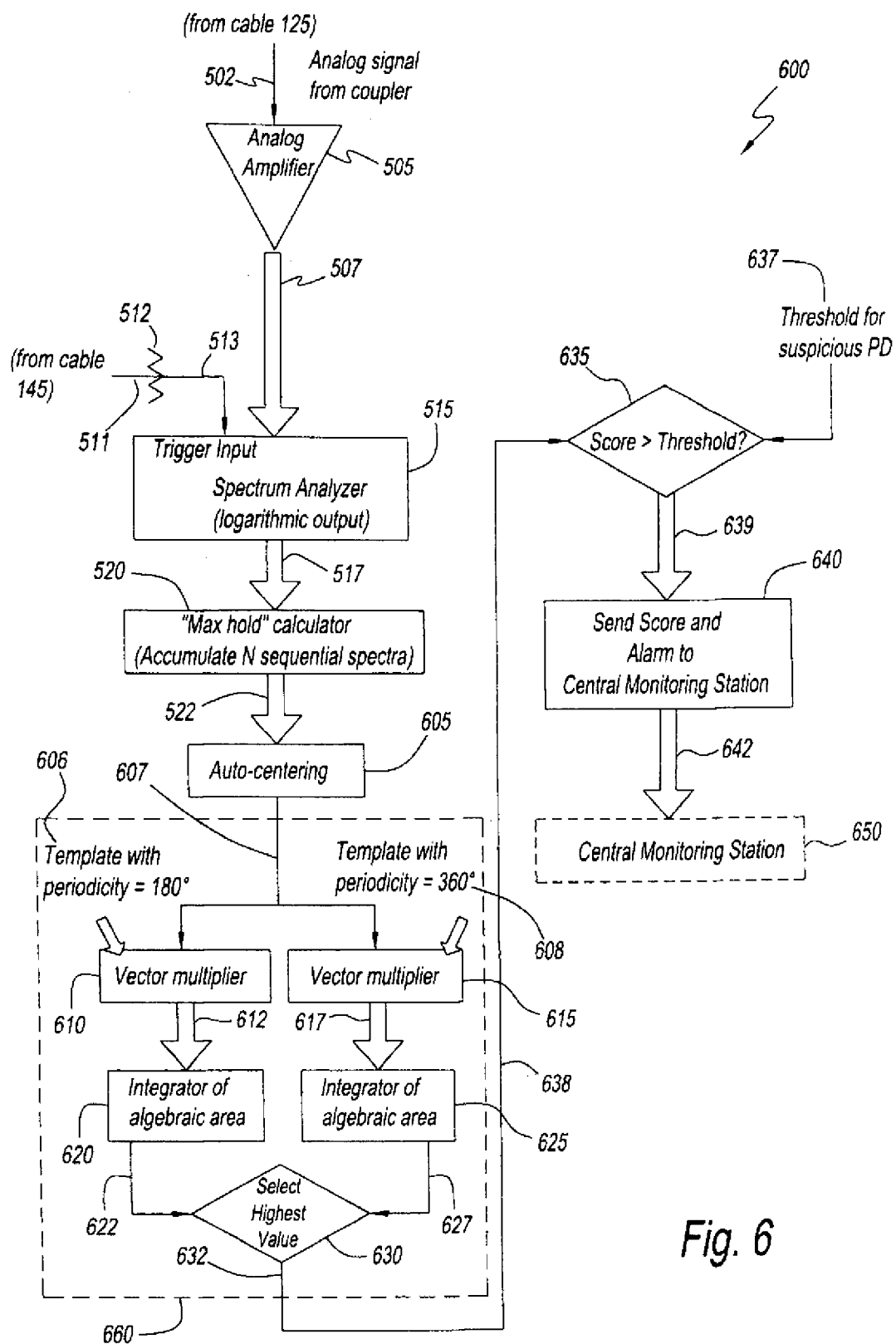

FIG. 10 is a graph of the spectra acquired by system 900. FIG. 10 includes five waveforms, i.e., one for each of the frequency ranges swept by spectrum analyzers 925A-925E. A waveform designated as "A" represents the frequency range swept by spectrum analyzer 925A, and a waveform designated as "C" represents the frequency range swept by spectrum analyzer 925C. Note that the horizontal axis represents phase and runs from 0 to 360 degrees for each of the five spectra. At a phase of about 250 degrees, waveform "A" includes a spectral component 1005 at a frequency of about 5 MHz, and waveform "C" includes a spectral component 1010 at a frequency of about 16 MHz. Since spectral components 1005 and 1010 both occurred at the same phase, they are both a result of a particular partial discharge.

Whereas spectrum analyzers 925A-925E are triggered simultaneously, all five spectra are derived from the same set of partial discharge pulses, and each partial discharge pulse is analyzed for its spectral strength at five different frequencies. Thus, spectral components of a single partial discharge can be correlated with one another and compared to one another. For example, since spectral components 1005 and 1010 are caused by a single partial discharge, magnitudes of spectral components 1005 and 1010 can be compared to one another, and a difference in the magnitudes can be attributed to attenuation of the partial discharge as it propagates along power line 910. Thus, system 900 is well-suited for evaluating a decrease of spectral magnitude with increasing frequency.

While various signal processing activities, (e.g., spectral analysis, peak detection, logarithmic scaling, determining parameters of power line noise signals, determining whether PD exists, and determining PD strength and location) are illustrated herein as being performed in a PD detector located near a signal coupler placed on a power cable, it should be understood that some or all of these signal processing activities may be performed at a central location.

The techniques described herein are exemplary, and should not be construed as implying any particular limitation on the present invention. It should be understood that various alternatives, combinations and modifications could be devised by those skilled in the art. The present invention is intended to embrace all such alternatives, modifications and variances that fall within the scope of the appended claims.

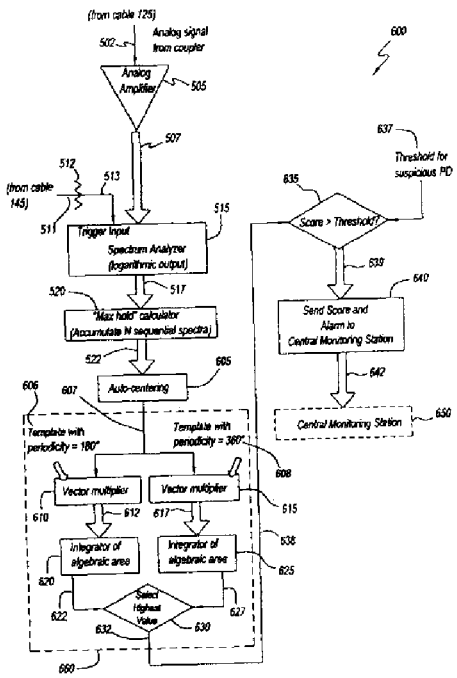

What is claimed is:

1. A method comprising:
acquiring a power spectrum of noise on a power line during a sweep of a range of frequencies,
wherein said sweep is triggered with respect to a phase of a power voltage on said power line;
determining a characteristic of a spectral component of a spectrum of said power spectrum; and
determining a condition of said power line based on said characteristics,
wherein said determining said characteristic comprises:
multiplying said power spectrum by a template waveform to yield a product waveform,
wherein said template waveform has a period that corresponds to either of (a) a period of said power voltage, or (b) one half of said period of said power voltage; and
integrating said product waveform to yield a score, and wherein said score is indicative of said characteristic.

2. The method of claim 1, wherein said determining said characteristic comprises determining whether said spectral component is synchronous with a phase of a power voltage on said power line.

3. The method of claim 1, wherein said determining said characteristic comprises determining whether said spectral component has a frequency equal to either of (a) a frequency of a power voltage on said power line, or (b) twice said frequency of said power voltage.

4. The method of claim 1, wherein said condition indicates an occurrence of a partial discharge on said power line if said score is greater than a threshold value.

5. The method of claim 1,
wherein said determining said characteristic is a determining of said characteristic at a first time,
wherein said method further comprises determining said characteristic at a second time, and
wherein said condition is based on whether said characteristic changes between said first time and said second time.

6. The method of claim 1, further comprising:
determining a first magnitude of a spectral component of said power spectrum having a first frequency;
determining a second magnitude of a spectral component of said power spectrum having a second frequency that is different from said first frequency; and
determining a difference between said first and second magnitudes, and
wherein said condition is further based on said difference.

7. The method of claim 6,
wherein said power spectrum is measured at a point on said power line, and
wherein said difference is indicative of a distance between said point and a source of a partial discharge on said power line.

8. The method of claim 1,
wherein said power spectrum comprises a first frequency range and a second frequency range, and wherein said first frequency range and said second frequency range are obtained simultaneously.

9. The method of claim 1,
wherein said power spectrum is a composite of a plurality of spectra, and
wherein said composite comprises a greatest magnitude detected for each of said plurality of spectra.

10. The method of claim 1,
wherein said method is employed at a plurality of locations in a power distribution system, thus yielding an indication of a power line condition detected at each of said plurality of locations, and
wherein said method further comprises communicating said indications of said power line condition detected at each of said plurality of locations to a central location.

11. The method of claim 10, further comprising comparing said indications of said power line condition detected at each of said plurality of locations to determine a most probable location for a source of partial discharge.

12. The method of claim 1, further comprising, prior to said determining said characteristic, acquiring discrete points of said power spectrum by a plurality of bandpass filters,
wherein said points are recorded with respect to a phase of a power voltage on said power line.

13. A method comprising:
acquiring a power spectrum of noise on a power line during a sweep of a range of frequencies,
wherein said sweep is triggered with respect to a phase of a power voltage on said power line;
determining a characteristic of a spectral component of a spectrum of said power spectrum; and
determining a condition of said power line based on said characteristic,
wherein said determining said characteristic comprises:
multiplying said power spectrum by a first template waveform to yield a first product waveform;
integrating said first product waveform to yield a first score;
multiplying said power spectrum by a second template waveform to yield a second product waveform;
integrating said second product waveform to yield a second score; and
selecting a greater of said first score or said second score, to yield a resultant score, and
wherein said resultant score is indicative of said characteristic.

14. The method of claim 13, wherein said first template has a first duty cycle and said second template has a second duty cycle.

15. A method comprising:
acquiring a power spectrum of noise on a power line during a sweep of a range of frequencies,
wherein said sweep is triggered with respect to a phase of a power voltage on said power line;
determining a characteristic of a spectral component of a spectrum of said power spectrum; and
determining a condition of said power line based on said characteristic,
wherein said determining said characteristic comprises:
multiplying said power spectrum by a template waveform to yield a first product waveform,
wherein said template waveform is periodic, and
wherein said multiplying is performed using a first phase relationship between said template waveform and said power spectrum;
integrating said first product waveform to yield a first score;
multiplying said power spectrum by said template waveform using a second phase relationship between said template waveform and said power spectrum, to yield a second product waveform;
integrating said second product waveform to yield a second score; and
selecting a greater of said first score or said second score, to yield a resultant score, and
wherein said resultant score is indicative of said characteristic.

16. A method comprising:
acquiring a power spectrum of noise on a power line during a sweep of a range of frequencies,
wherein said sweep is triggered with respect to a phase of a power voltage on said power line;
determining a characteristic of a spectral component of a spectrum of said power spectrum; and
determining a condition of said power line based on said characteristic,
wherein said determining said characteristic comprises:
multiplying said power spectrum by a template waveform to yield a first product waveform,
wherein said template waveform has a period that corresponds to a period of said power voltage, and
wherein said multiplying is performed with said template waveform being substantially in-phase with said power spectrum;
integrating said first product waveform to yield a first score;
multiplying said power spectrum by said template waveform with said template waveform being shifted by 180 degrees, to yield a second product waveform;
integrating said second product waveform to yield a second score; and
calculating a ratio of said first score and said second score, and
wherein said ratio is indicative of said characteristic.

17. A system comprising:
a device that acquires a power spectrum of noise on a power line during a sweep of a range of frequencies, wherein said sweep is triggered with respect to a phase of a power voltage on said power line; and
a processor that:
(a) determines a characteristic of a spectral component of a spectrum of said power spectrum; and
(b) determines a condition of said power line based on said characteristic,
wherein said determining said characteristic comprises:
multiplying said power spectrum by a template waveform to yield a product waveform,
wherein said template waveform has a period that corresponds to either of (a) a period of said power voltage, or (b) one half of said period of said power voltage; and
integrating said product waveform to yield a score, and
wherein said score is indicative of said characteristic.

* * * * *

UNITED STATES PATENT AND TRADEMARK OFFICE
CERTIFICATE OF CORRECTION

| | |
|---|---|
| PATENT NO. | : 7,532,012 B2 |
| APPLICATION NO. | : 11/584322 |
| DATED | : May 12, 2009 |
| INVENTOR(S) | : Cern |

It is certified that error appears in the above-identified patent and that said Letters Patent is hereby corrected as shown below:

The Title page;

The Title page, showing the illustrative figure, should be deleted and substitute therefor the attached Title page.

Delete fig. 6 and substitute therefor the drawing sheet, consisting of fig. 6 as shown on the attached page.

Signed and Sealed this
Fifteenth Day of March, 2011

David J. Kappos
*Director of the United States Patent and Trademark Office*

(12) United States Patent
Cern

(10) Patent No.: US 7,532,012 B2
(45) Date of Patent: May 12, 2009

(54) DETECTION AND MONITORING OF PARTIAL DISCHARGE OF A POWER LINE

(75) Inventor: Yehuda Cern, Efrat (IL)

(73) Assignee: Ambient Corporation, Newton, MA (US)

(*) Notice: Subject to any disclaimer, the term of this patent is extended or adjusted under 35 U.S.C. 154(b) by 170 days.

(21) Appl. No.: 11/584,322

(22) Filed: Oct. 20, 2006

(65) Prior Publication Data
US 2008/0048710 A1 Feb. 28, 2008

Related U.S. Application Data

(60) Provisional application No. 60/819,072, filed on Jul. 7, 2006.

(51) Int. Cl.
G01R 31/12 (2006.01)
H01H 9/50 (2006.01)

(52) U.S. Cl. .............................................. 324/536
(58) Field of Classification Search ............ 324/536
See application file for complete search history.

(56) References Cited

U.S. PATENT DOCUMENTS

| | | | |
|---|---|---|---|
| 4,897,607 A * | 1/1990 | Grunewald et al. | 324/512 |
| 5,146,170 A | 9/1992 | Ishikawa et al | |
| 5,469,067 A | 11/1995 | Endoh et al. | |
| 5,642,038 A | 6/1997 | Kim et al. | |
| RE35,561 E | 7/1997 | Mashikian et al. | |
| 5,828,227 A | 10/1998 | Shiota et al. | |
| 6,064,172 A | 5/2000 | Kuznetsov | |
| 6,192,317 B1 | 2/2001 | Yazici et al. | |
| 6,297,642 B1 | 10/2001 | Shibahara et al. | |
| 6,420,879 B2 | 7/2002 | Cooke | |
| 6,445,189 B1 | 9/2002 | Pakonen | |
| 6,507,181 B1 | 1/2003 | Pakonen et al. | |
| 6,661,235 B2 | 12/2003 | Rokunohe et al | |
| 6,798,211 B1 | 9/2004 | Rockwell et al. | |
| 6,809,523 B1 * | 10/2004 | Ahmed et al. | 324/520 |
| 6,822,457 B2 | 11/2004 | Borchert et al. | |
| 6,876,203 B2 | 4/2005 | Blades | |
| 6,937,027 B2 | 8/2005 | Koo et al. | |
| 2005/0184737 A1 * | 8/2005 | Moriyama et al. | 324/536 |

* cited by examiner

*Primary Examiner* —Amy He
(74) *Attorney, Agent, or Firm* Ohlandt, Greeley, Ruggiero & Perle, L.L.P.

(57) ABSTRACT

There is provided a method that includes (a) determining a characteristic of a fundamental spectral component of a spectrum of a power spectrum of noise on a power line, and (b) determining a condition of the power line based on the characteristic.

17 Claims, 17 Drawing Sheets